(12) United States Patent
Chun

(10) Patent No.: US 10,103,686 B2
(45) Date of Patent: Oct. 16, 2018

(54) DEVICE AND METHOD FOR PHOTOVOLTAIC POWER GENERATION USING OPTICAL BEAM UNIFORMLY CONDENSED BY USING FLAT MIRRORS AND COOLING METHOD BY DIRECT CONTACT

(71) Applicant: Mie-ae Kim, Daejeon (KR)

(72) Inventor: Dae-sik Chun, Daejeon (KR)

(73) Assignee: Mie-ae Kim, Daejeon (KR)

( * ) Notice: Subject to any disclaimer, the term of this patent is extended or adjusted under 35 U.S.C. 154(b) by 0 days.

(21) Appl. No.: 14/981,750

(22) Filed: Dec. 28, 2015

(65) Prior Publication Data

US 2016/0118930 A1 Apr. 28, 2016

Related U.S. Application Data

(63) Continuation of application No. PCT/KR2014/005570, filed on Jun. 24, 2014.

(30) Foreign Application Priority Data

Jun. 25, 2013 (KR) .................. 10-2013-0073282

(51) Int. Cl.
*H01L 31/042* (2014.01)
*F24J 2/08* (2006.01)
(Continued)

(52) U.S. Cl.
CPC .......... *H02S 20/32* (2014.12); *H01L 31/0547* (2014.12); *H01L 31/0549* (2014.12);
(Continued)

(58) Field of Classification Search
CPC .......... H02S 40/20; H02S 40/22; H02S 40/42; H01L 31/0547; H01L 31/0549; F24J 2002/16; F24J 2002/5417; Y02E 10/52
See application file for complete search history.

(56) References Cited

U.S. PATENT DOCUMENTS

| 4,323,052 A | * | 4/1982 | Stark | .......................... C02F 1/14 |
| | | | | 126/571 |
| 4,395,581 A | * | 7/1983 | Girard | ....................... F24J 2/12 |
| | | | | 126/595 |

(Continued)

FOREIGN PATENT DOCUMENTS

| JP | 2002-115917 A | | 4/2002 | |
| JP | WO2012056806 | * | 5/2012 | .......... H01L 31/042 |

(Continued)

OTHER PUBLICATIONS

Korean Intellectual Property Office, International Search Report, International Patent Application No. PCT/KR2014/005570, dated Dec. 4, 2014, 3 pages.

(Continued)

*Primary Examiner* — Uyen M Tran
(74) *Attorney, Agent, or Firm* — Perkins Coie LLP

(57) ABSTRACT

Disclosed is technology pertaining to a device and method for photovoltaic power generation using a photoelectric effect. The device for photovoltaic power generation includes: a frame; a photovoltaic panel arranged on the frame such that a light receiving surface is perpendicular to an incident direction of sunlight with the back thereof against the sun; two or more flat mirrors which are arranged on the frame and reflect the incident sunlight to the light receiving surface of the photovoltaic panel; a rotation mechanism for tracking the sun such that the light receiving surface of the photovoltaic panel is perpendicular to the incident direction of the sunlight by rotating the frame in a biaxial direction; and a supporting structure for supporting the frame and the rotation mechanism.

15 Claims, 18 Drawing Sheets

(51) Int. Cl.
*H02S 20/32* (2014.01)
*H02S 40/22* (2014.01)
*H02S 40/42* (2014.01)
*H02S 30/10* (2014.01)
*H02S 40/20* (2014.01)
*H01L 31/054* (2014.01)
*F24S 23/77* (2018.01)
*F24S 30/45* (2018.01)
*F24S 23/70* (2018.01)
*F24J 2/16* (2006.01)
*F24J 2/54* (2006.01)
*F24J 2/10* (2006.01)

(52) U.S. Cl.
CPC .............. *H02S 30/10* (2014.12); *H02S 40/20* (2014.12); *H02S 40/22* (2014.12); *H02S 40/425* (2014.12); *F24J 2/16* (2013.01); *F24J 2/5417* (2013.01); *F24J 2002/109* (2013.01); *F24S 23/77* (2018.05); *F24S 30/45* (2018.05); *F24S 2023/876* (2018.05); *Y02E 10/52* (2013.01)

(56) References Cited

U.S. PATENT DOCUMENTS

| | | | | |
|---|---|---|---|---|
| 5,522,944 | A | * | 6/1996 | Elazari ................ F24D 11/003 126/585 |
| 5,983,634 | A | * | 11/1999 | Drucker ................... F03D 1/04 60/398 |
| 2006/0049167 | A1 | * | 3/2006 | Yang ...................... B01J 47/006 219/388 |
| 2008/0257399 | A1 | * | 10/2008 | Wong .................... H01L 31/043 136/246 |
| 2010/0236599 | A1 | * | 9/2010 | Metzler .................. F24J 2/1047 136/246 |
| 2013/0213460 | A1 | * | 8/2013 | Matsumoto ............. H01L 35/00 136/253 |

FOREIGN PATENT DOCUMENTS

| | | |
|---|---|---|
| KR | 10-2001-0100071 A | 11/2001 |
| KR | 20-0354040 | 6/2004 |
| KR | 10-1038529 B1 | 6/2011 |
| KR | 10-2012-0096971 A | 9/2012 |

OTHER PUBLICATIONS

Korean Intellectual Property Office, Notice of Preliminary Rejection, Korean Patent Application No. 10-2013-0073282, dated Jun. 25, 2015, 6 pages (including English translation).
www.sosmath.com/trig/prodform/prodform.html, last visited Mar. 21, 2018.

* cited by examiner

AM(φ)  AM1

DEVICE AND METHOD FOR PHOTOVOLTAIC POWER GENERATION USING OPTICAL BEAM UNIFORMLY CONDENSED BY USING FLAT MIRRORS AND COOLING METHOD BY DIRECT CONTACT

PRIORITY CLAIMS AND CROSS-REFERENCE TO RELATED APPLICATION

This patent document is a continuation application of a Patent Cooperation Treaty (PCT) application number PCT/KR2014/005570 entitled "PHOTOVOLTAIC POWER GENERATION DEVICE AND METHOD USING OPTICAL BEAM UNIFORMLY CONDENSED BY USING PLANE MIRRORS AND COOLING METHOD BY DIRECT CONTACT", filed on Jun. 24, 2014, which claims priority from and the benefits of Korean Patent Application No. 10-2013-0073282, filed on Jun. 25, 2013. The entire disclosures of the above applications are incorporated by reference as part of this document.

TECHNICAL FIELD

This patent document relates generally to a device and method for photovoltaic power generation which are commercially available. More particularly, some embodiments relate to photovoltaic power generation technology that combines light condensing, sun tracking, and cooling of photovoltaic panels to reduce the cost of photovoltaic power generation and makes it possible to compete with existing power generation such as thermal power generation or nuclear power generation without relying on subsidies.

BACKGROUND

It has been more than a century since the photoelectric effect was discovered by Einstein, and half a century since a solar cell developed by the National Aeronautics and Space Administration (NASA) of the United States was used in artificial satellites. However, power generation projects that are known to be based on the solar cell for a few decades have not yet been successful as profitable self-supporting projects. The primary reason is the high price of a photovoltaic panel. It was reported on April, 2013 that the photovoltaic panel can be supplied at a price of about $1 per watt (W). In the case of Korea, it is reported that a supply price of electric power is about $0.1/KWh. A purchase price of the photovoltaic panel required for 1 MW-class photovoltaic power generation plant and an annual electricity production capacity (electric power sale) are compared as follows (in the case of Korea, it is reported that average photovoltaic power generation can be conducted using sunlight of 1 KW/m² for about 3.5 hours per day on average when annualized.).

Price of 1 MW-class photovoltaic panel: $1,000,000 ($1/Watt)

Annual electricity production capacity of 1 MW-class photovoltaic panel (price of annually produced electric power): 1 MW×3.5 h×365 days=1,2775 MWh/year ($127,750/year)

In detail, in view of the fact that income obtained by selling electric power for 7.8 years should be invested for only an expense required to purchase the photovoltaic panel and other incidental expenses (it is reported that, excluding a land cost, an expense about equivalent to the price of the photovoltaic panel is invested), a photovoltaic power generation industry is not very attractive at this point. It is reported that some districts, such as Italy, Hawaii, etc. in which a price of commercial electric power is highly fixed and which have an abundance of solar radiation, approach grid parity. Grid parity refers to a point in time at which the price of commercial electric power is equal to the cost of photovoltaic power generation. In the case of Korea, the supply price of electric power is relatively low, and it is more difficult to achieve the grid parity.

SUMMARY

Various implementations of the disclosed technology are to reduce a cost of photovoltaic power generation to allow a photovoltaic power generation project to be commercially conducted without a support policy from public sectors. Some implementations of the disclosed technology provide a method and device capable of producing much electric power from a photovoltaic panel with a fixed area.

In one aspect, a device for photovoltaic power generation is provided to include a frame; a photovoltaic panel disposed on the frame; two or more flat mirrors disposed on the frame; a rotation mechanism configured to rotate the frame biaxially to track sunlight; and a supporting structure configured to support the frame and the rotation mechanism, wherein the photovoltaic panel and the flat mirrors are disposed on the frame to meet a predetermined relationship, said predetermined relationship including relations that, in an orthogonal coordinate system whose reference lines vary to allow a unit vector in a traveling direction of sunlight to be (0, 0, 1) when the rotation mechanism normally tracks the sun, (i) a z-axial component of a unit vector in a direction normal to a light receiving surface of the photovoltaic panel has a positive value, and (ii) a z-axial component of a unit vector in a direction normal to a reflective surface of each of the flat mirrors has a negative value to allow the sunlight reflected by each of the flat mirrors to be uniformly incident upon the light receiving surface of the photovoltaic panel, wherein the photovoltaic panel and the flat mirrors are disposed on the frame such that projected images of the flat mirrors on an x-y plane of the orthogonal coordinate system are arranged around a projected image of the photovoltaic panel on the x-y plane of the orthogonal coordinate system in a matrix pattern, wherein an x axis length ($M_x^{i,j}$) and a y axis length ($M_y^{i,j}$) of an arbitrary one ($M^{i,j}$) of the flat mirrors are set to meet the conditions: $M_x^{i,j} \geq p_x \times (cos2\theta_x^{i,j}/cos\theta_x^{i,j}) + \delta_x^{i,j}$ and $M_y^{i,j} \geq p_y \times (cos2\theta_y^{i,j}/cos\theta_y^{i,j}) + \delta_y^{i,j}$, where (i) $p_x$ and $p_y$ represent an x-axis length and a-y axis length of the photovoltaic panel, respectively, (ii) $\delta_x^{i,j}$ and $\delta_y^{i,j}$ represent a minimum x-axis marginal length and a minimum y-axis marginal length of one of the flat mirrors ($M^{i,j}$), respectively, as required to offset arrangement errors of the photovoltaic panel and the flat mirror ($M^{i,j}$), an operational error of the rotation mechanism, and vibration to be caused by an external force including wind, and (iii) $\theta_x^{i,j}$ and $\theta_y^{i,j}$ are obtained from the equations: $tan\ 2\theta_x^{i,j}=d_x^{i,j}/l^{i,j}$ and $tan\ 2\theta_y^{i,j}/l^{i,j}$ where a vector ($d_x^{i,j}$, $d_y^{i,j}$, $l^{i,j}$) is a displacement vector from a center of the light receiving surface of the photovoltaic panel to a center of a reflective surface of the flat mirror ($M^{i,j}$) in the orthogonal coordinate system, and wherein the rotation mechanism is further configured to rotate the fame according to a change in position of the sun such that the predetermined relationship between the photovoltaic panel and the flat miners is maintained.

In another aspect, a device for photovoltaic power generation is provided to comprise: a fame; a photovoltaic panel disposed on the fame; two or more flat mirrors disposed on the frame; a rotation mechanism configured to rotate the fame biaxially to track sunlight; and a supporting structure configured to support the fame and the rotation mechanism, wherein the photovoltaic panel and the flat mirrors are disposed on the frame to meet a predetermined relationship, said predetermined relationship including a condition that, in an orthogonal coordinate system whose reference lines vary to allow a unit vector in a traveling direction of sunlight to be (0, 0, 1) when the rotation mechanism normally tracks the sun, (i) a z-axial component of a unit vector in a direction normal to a light receiving surface of the photovoltaic panel has a positive value, and (ii) a z-axial component of a unit vector in a direction normal to a reflective surface of each of the flat mirrors has a negative value to allow the sunlight reflected by each of the flat mirrors to be uniformly incident upon the light receiving surface of the photovoltaic panel, wherein said device further includes a cooling system configured to cool the photovoltaic panel, said cooling system including a fluidic coolant that is in direct contact with surfaces of the photovoltaic panel, and wherein the rotation mechanism is further configured to rotate the frame according to a change in position of the sun such that the predetermined relationship between the photovoltaic panel and the flat mirrors is maintained.

In some implementations, the photovoltaic panel is disposed on the frame such that the unit vector in the direction normal to the light receiving surface of the photovoltaic panel is (0, 0, 1). In some implementations, an optical filter to selectively transmit light of a wavelength effective for photoelectric conversion by the photovoltaic panel is mounted on at least one of the reflective surface of each of the flat mirrors or the light receiving surface of the photovoltaic panel. In some implementations, the sun tracking system comprises first rotating means configured to rotate the fame in a vertical direction and second rotating means configured to rotate the frame in a horizontal direction. In some implementations, the fame is configured not to block the sunlight on an optical path from the sun to the photovoltaic panel via the flat mirrors. In some implementations, a variable number of flat mirrors among the flat mirrors are in use for light condensing according to an intensity of the sunlight before light condensing in order to obtain a reflected light condensed to a proper level. In some implementations, the device further comprises a supplementary panel located on a rear surface of the photovoltaic panel, wherein the supplementary panel is disposed on the fame such that a unit vector in a direction normal to a light receiving surface of the supplementary panel is (0, 0, −1). In some implementations, the cooling system comprises: a sealed housing, at least a portion of at least one surface of the sealed housing being open; a transparent window configured to cover the open portion of the housing to seal the housing and transmit incident light to be incident upon the light receiving surface of the photovoltaic panel; and a holder configured to fix the photovoltaic panel to be disposed within the housing at a predetermined distance from an internal surface of the window, wherein the fluidic coolant is filled in the housing to wrap and cool the photovoltaic panel.

In another aspect, a cooling system for cooling a photovoltaic panel is provided to comprise: a sealed housing, at least a portion of at least one surface of the sealed housing being open; a transparent window configured to cover the open portion of the housing to seal the housing and transmit incident light to be incident upon a light receiving surface of the photovoltaic panel; a holder configured to fix the photovoltaic panel to be disposed within the housing at a predetermined distance from an internal surface of the window; and a fluidic coolant filled in the housing to wrap and cool the photovoltaic panel.

In some implementations, a plurality of valves or holes are provided on a portion of the housing to allow the fluidic coolant to flow into and out of the housing and allow electric wires to be connected thereto. In some implementations, the cooling system further comprises a circulator configured to cause forcible convection of the coolant in the housing. In some implementations, the window and the photovoltaic panel are removably coupled to the housing and the holder, respectively. In some implementations, an optical filter to selectively transmit light of a wavelength effective for photoelectric conversion by the photovoltaic panel is provided on the window of the cooling system. In some implementations, the fluidic coolant of the cooling system comprises an optical filtering material or dye to selectively transmit light of a wavelength effective for photoelectric conversion by the photovoltaic panel. In some implementations, the fluidic coolant is water or refrigerant. In some implementations, the water or refrigerant includes an antifoaming agent to inhibit bubbles from being generated in the cooling water. In some implementations, the water or refrigerant further includes an anti-freezing solution to prevent the water or refrigerant from being frozen.

In another aspect, electric energy produced using any one of the device for photovoltaic power generation or the cooling system for cooling a photovoltaic panel is provided.

In another aspect, a method of producing electric power using any one of the device for photovoltaic power generation or the cooling system for cooling a photovoltaic panel is provided.

Some embodiments of the disclosed technology suggest disposing the photovoltaic panel in a housing in which a coolant is contained. A light receiving surface of the photovoltaic panel is disposed to face a transparent window through which the sunlight is transmitted. An exemplary example of the coolant is water or a refrigerant. For smooth convection of this refrigerant, the photovoltaic panel is disposed at an adequate distance from an internal surface of the transparent window, and the distance is set to be small such that a quantity of the sunlight absorbed by the refrigerant is minimized.

Since the refrigerant having great specific heat is in direct contact with overall external surfaces (front and rear surfaces) of the photovoltaic panel, the disclosed technology will have remarkably higher cooling efficiency than the cooling technique in the related art.

Some implementations of the disclosed technology allow to reduce the cost of the photovoltaic power generation. That is, when the same expense is invested for a photovoltaic power generation plant and maintenance, the disclosed technology produces more electric power compared to the related art. The flat mirror is far less expensive than means (a lens, a curved mirror, etc.) required for light condensing in the related art, is lighter, and can be mass produced.

Some implementations of the disclosed technology allow to prevent deterioration of the photovoltaic panel to extend a service life. This is an additional effect that can be obtained from an embodiment in which the photovoltaic panel is disposed in a cooling housing.

Some implementations of the disclosed technology can project the sunlight to the photovoltaic panel with a sufficient intensity on a condition that the intensity of the sunlight is low (morning and late afternoon, winter, high-latitude area, cloudy or foggy weather). When the number of flat mirrors is sufficiently increased, although the intensity of the sunlight is very low, the sunlight can be uniformly condensed on the photovoltaic panel with an intensity more than the intensity of the sunlight when the sun is located at the zenith.

Some implementations of the disclosed technology can easily carry out the light condensing on the entire photovoltaic panel with a uniform intensity in spite of low precision. This is an effect that can be obtained by adding a predetermined value to a length and width of each flat mirror as a margin so as to be greater than values given by $m_x=p_x\times(\cos 2\theta_x/\cos \theta_x)$ and $m_y=p_y\times(\cos 2\theta_y/\cos \theta_y)$ to be described below. As a magnitude of the margin increases, required precision may be further reduced. The reason can be easily understood by those skilled in the art through the contents of FIGS. 4 and 5.

DETAILED DESCRIPTION

The disclosed technology provides a technique for the photovoltaic power generation to reduce the cost of power generation. The governments of various countries including Korea are trying to foster the photovoltaic power generation industry through a feed-in tariff (FIT) and a renewable portfolio standard (RPS), but they have a limitation due to a financial burden. Thus, the necessity of securing commercially renewable photovoltaic power generation technology is urgent. This directly means that technology for reducing the cost of electric power production in a photovoltaic power generation field is needed.

It is important to produce more electric power using the photovoltaic panel having a given area. To this end, an attempt to increase photoelectric conversion efficiency of a solar cell, an attempt to suppress a rise in temperature of a photovoltaic module to increase photovoltaic power generation efficiency, an attempt to increase production of the electric power relative to the cost through light condensing, an attempt to produce the photoelectric cell substrate at a low cost, etc. are being made.

Related arts having a deep relation with the technical idea and spirit of the disclosed technology are photoelectric power generation technologies to which light condensing and cooling are applied.

Figure 1A:
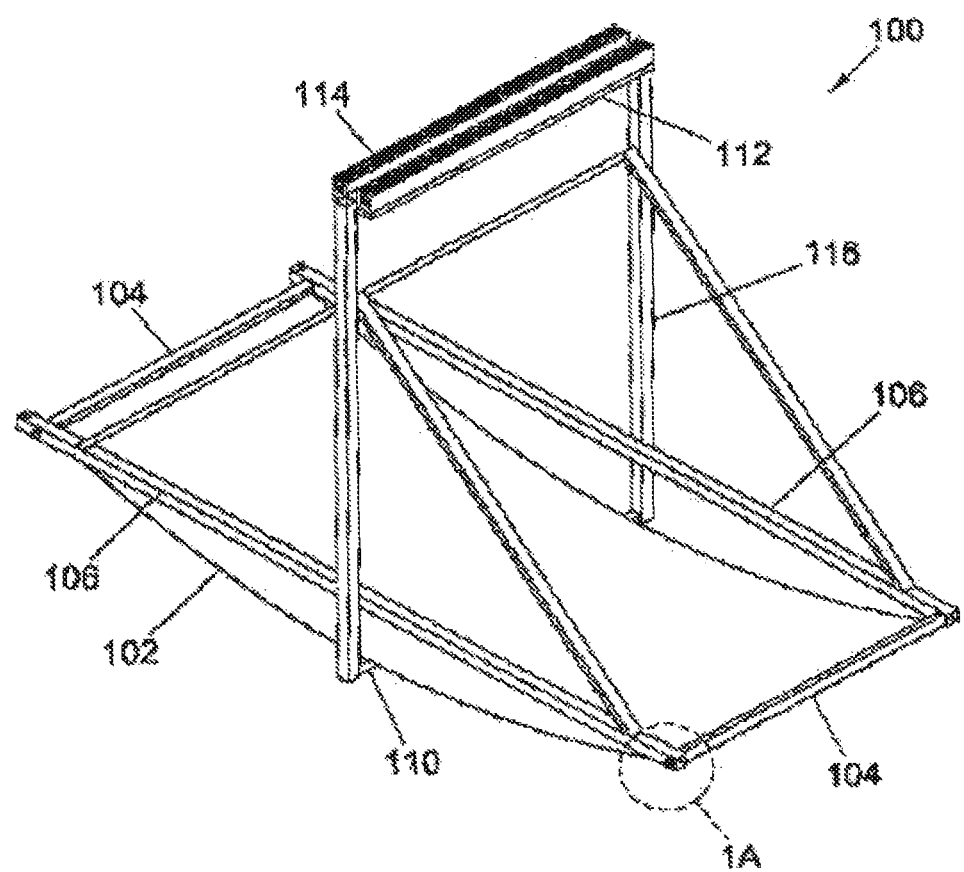
FIGS. 1a to 1d are representative views of prior patents associated with photovoltaic power generation using light condensing.
Figure 1B:
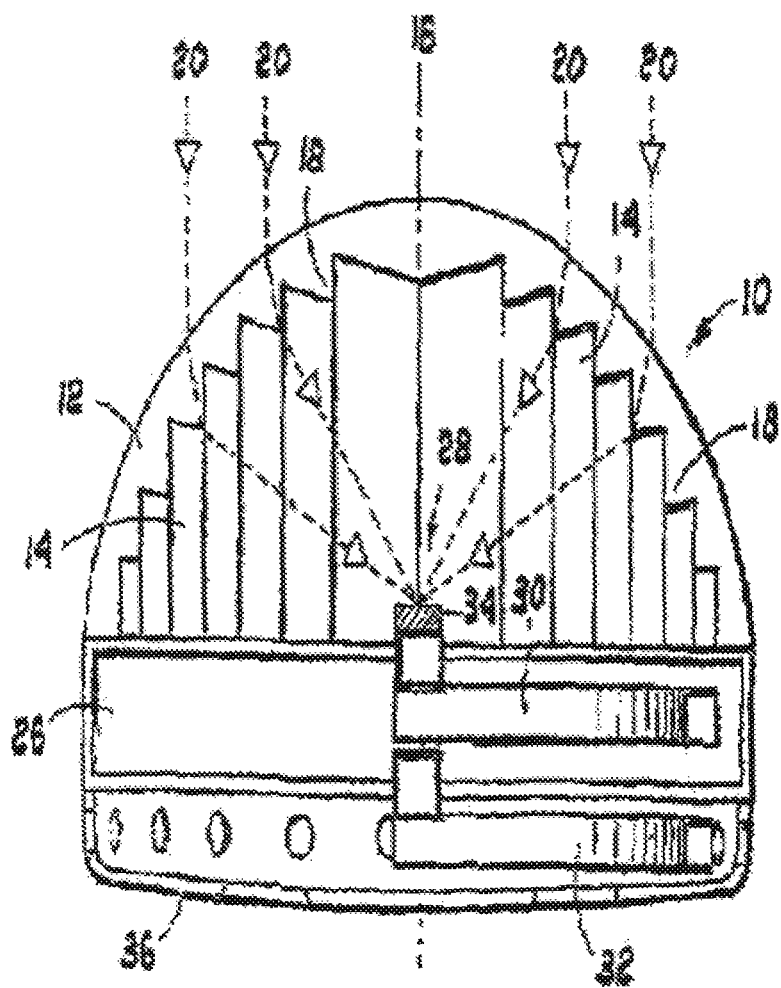
Figure 1C:
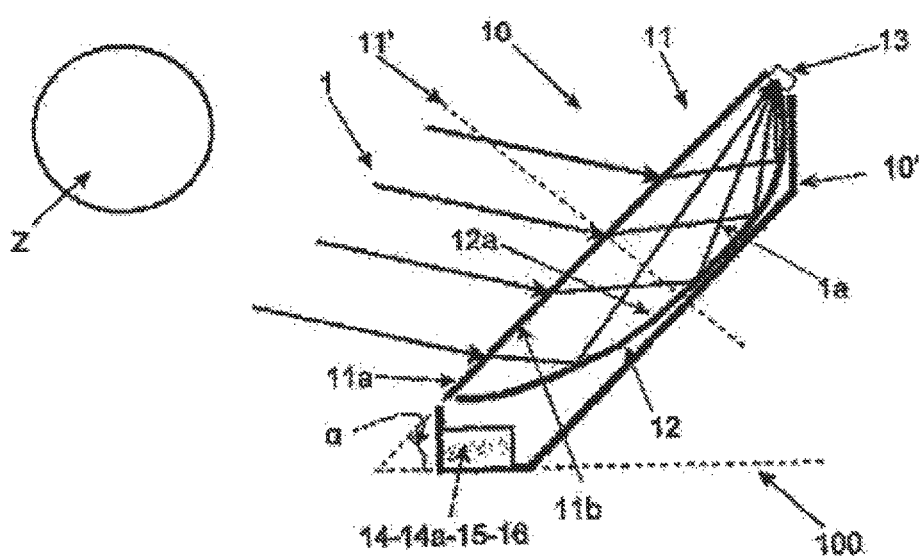
Figure 1D:
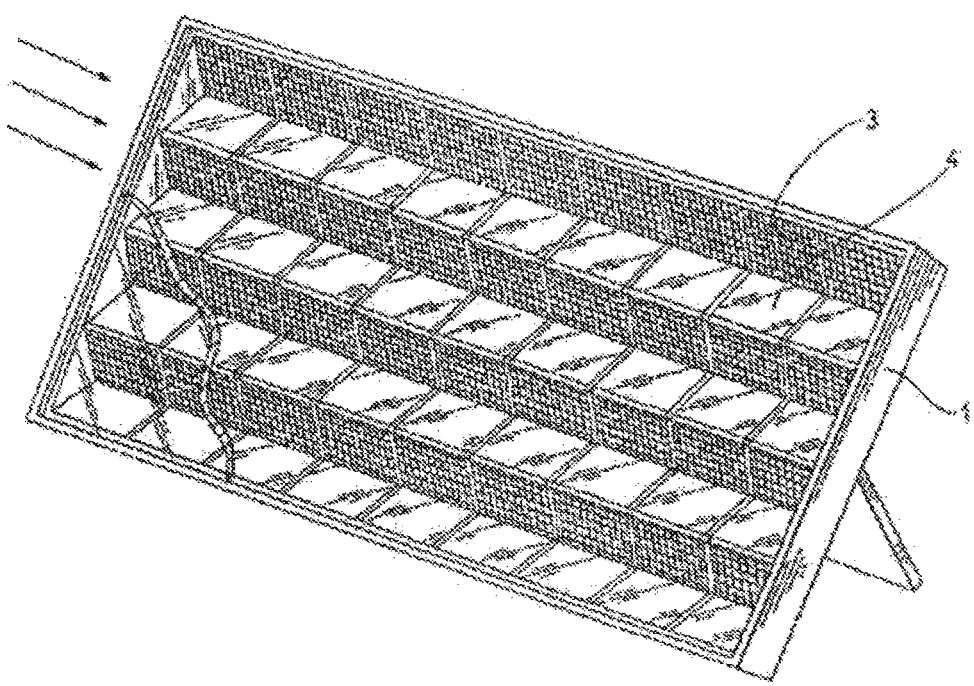

FIGS. 1a to 1d are representative views of conventional patent techniques published in relation to photovoltaic power generation technology using light condensing. The representative views of conventional patent techniques, JP 2009-545186A (FIG. 1a), JP 2003-536244A (FIG. 1b), JP 2009-533841A (FIG. 1c), and JP 2009-545877A (FIG. 1d), are presented in turn. The techniques of FIGS. 1a, 1b and 1c use lenses or spherical mirrors, and thus still include problems of the related arts to be described below (see the portion "1. Light condensing using flat mirrors" of the section "Technical Solution" to be described below). The technique of FIG. 1d is related with the content of the disclosed technology in that flat mirrors are used for light condensing. However, in the structure illustrated in FIG. 1d, it is difficult to achieve a high level of light condensing which the disclosed technology pursues.

Figure 1E:
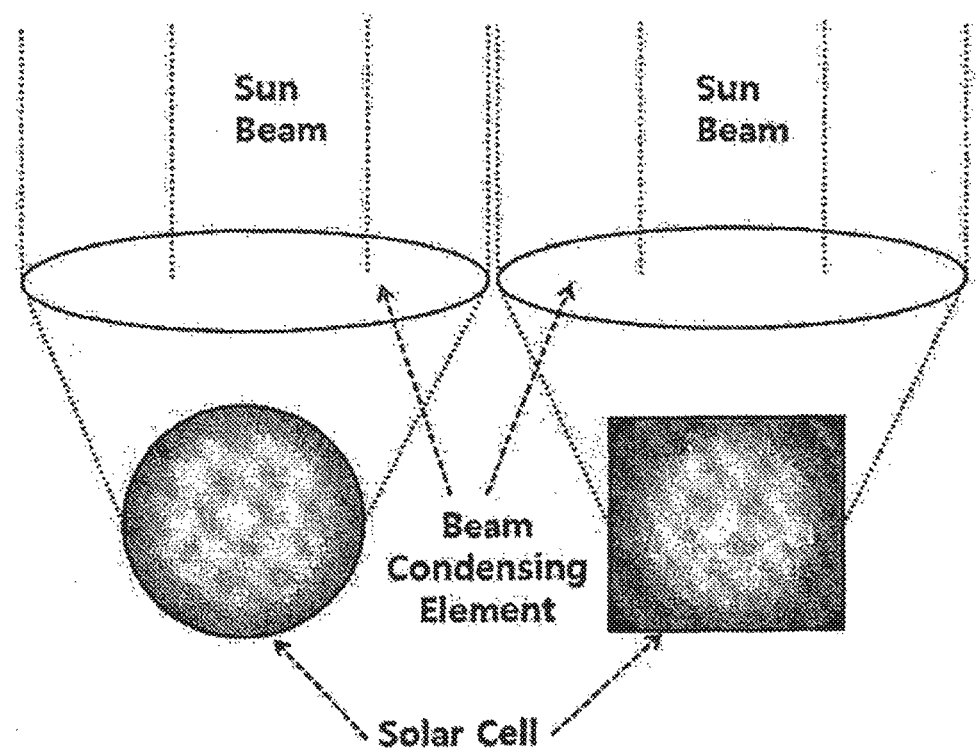
FIG. 1e is a view for describing problems of a conventional condensing technique using a lens or a curved mirror.

FIG. 1e is a view attached to describe the problems of the related arts which are pointed out in the portion "1. Light condensing using flat mirrors" of the section "Technical Solution" to be described below.

The related art using a curved lens, a Fresnel lens, or a curved mirror has a problem in that a condensed beam has a non-uniform intensity in a radial direction, and is not matched with a rectangular photovoltaic panel because it has a circular shape.

Further, the condensing technique of FIG. 1b is intended to use a tandem solar cell that is high in photoelectric conversion efficiency, is expensive, and has a small area. For this reason, the conventional condensing technique is not suitable to condense sunlight on a photovoltaic panel of a large area with uniform intensity.

Related arts associated with cooling include an air cooling method based on a heat sink, a water cooling method in which a rear surface of a photovoltaic module is in contact with a heat sink in which a coolant is contained or circulated, and so on. However, only the rear surface of a photovoltaic panel is mainly cooled so as not to disturb incidence of sunlight, and the coolant is not in direct contact with an external surface of the photovoltaic panel. Therefore, cooling efficiency is largely inadequate.

The disclosed technology provides a method and device to which light condensing based on a flat mirror, sun tracking for the light condensing, and cooling of heat caused by the light condensing are applied to produce maximum electric power from a photovoltaic panel having the same class.

In the disclosed technology, the following three main technical ideas are selectively combined.

1. Light Condensing Using Flat Mirror

Problems of light condensing technology using a condensing lens, a concave mirror, or a Fresnel lens (hereinafter "conventional light condensing devices") in the related art are as follows.

(1) It is very difficult and expensive to manufacture a photovoltaic system using the conventional light condensing devices because very high precision is required. (2) The shape of a rectangular photovoltaic panel and the shape of the condensed beam (typically in a circular shape) of the conventional light condensing devices are mismatched. (3) The weight of the conventional light condensing devices is not small. (4) The intensity of the condensed sunlight is non-uniform in a radial direction (see FIG. 1e).

The fact that the intensity of the condensed beam is non-uniform has an adverse effect on the photovoltaic power generation. In the case of a solar collector system distinguished from the photovoltaic power generation, although the intensity of the condensed beam is non-uniform, this does not matter. When solar heat is used, a total quantity of condensed sunlight reaching a solar collector is only a concern, and uniformity of beams of the condensed sunlight has no particular influence on performance. In contrast, in the case of the photovoltaic power generation, uniformity of beams of the condensed sunlight has a very important influence on performance. This is because output currents of unit cells connected in series are determined by the smallest value of values of the output currents of unit cells connected in series, and the output current of each of the unit cells is proportional to a local intensity of the sunlight incident upon each of the unit cells.

The disclosed technology can easily avoid the problems accompanied with the light condensing method of the related art at a low cost by overlapping and condensing uniform reflected light on the photovoltaic panel using rectangular flat mirrors so as to match a shape (rectangular shape) of the photovoltaic panel.

2. Sun Tracking Method

The disclosed technology employs a photovoltaic power generation method using light condensing, and thus may obtain high efficiency when applied along with a sun tracking method. A rotation mechanism is a technique that has been widely known in the related technical field for a long time and is commercially available.

3. Cooling

It is reported that a typical silicon photovoltaic module that does not condense the sunlight rises to a temperature more than 60° C. to 70° C. at noon in the summer, and photoelectric conversion efficiency is reduced by a predetermined rate (by 0.5%) whenever the temperature rises in units of 1°. If the sunlight is condensed on the photovoltaic panel by several times to tens of times by the disclosed technology, a rise in temperature and a rapid drop of the photoelectric conversion efficiency are inevitable. The prediction of the inventor of the disclosed technology is as follows. A portion that is most sensitive to the temperature rise and has the greatest influence on the photoelectric conversion efficiency is possibly a semiconductor layer. The conventional cooling method is to cool the outside of a rear surface that is relatively more distant from the semiconductor layer. This method does not effectively prevent the temperature rise of the semiconductor layer that absorbs the sunlight and generates free electrons which produce the greatest influence on the photoelectric conversion efficiency.

Various exemplary embodiments of the disclosed technology will be described in detail with reference to the attached drawings.

Figure 2:
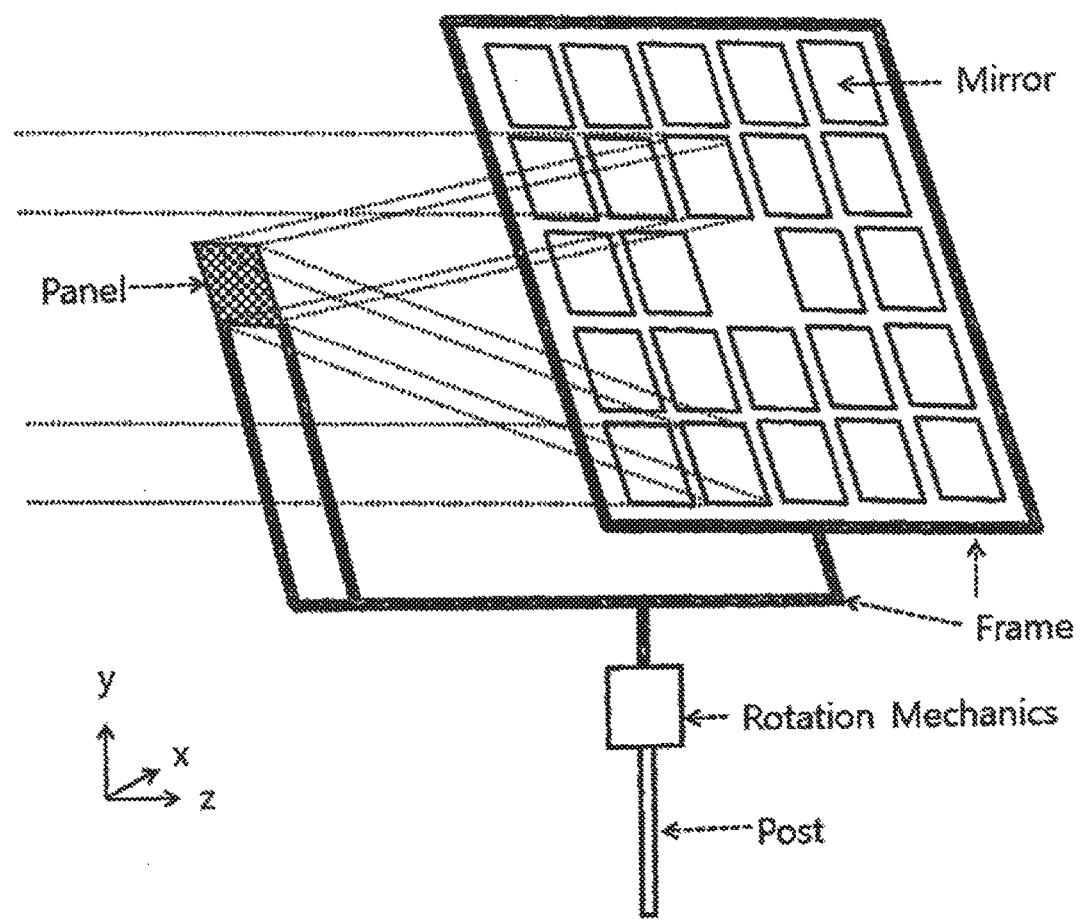
FIG. 2 is a view for describing a condensing method using flat mirrors and a rotation mechanism according to the disclosed technology.
Figure 3:
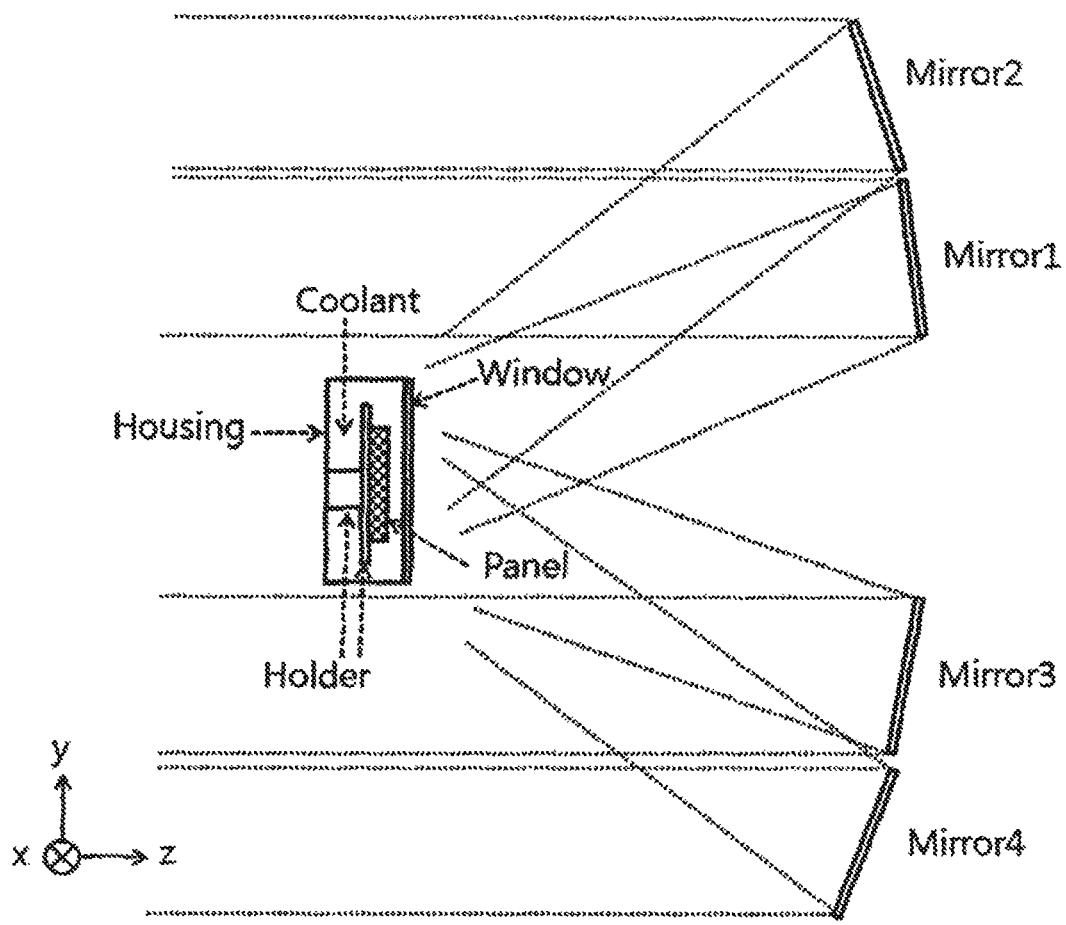
FIG. 3 is a view for describing both a cooling method using a housing and the light condensing method using flat mirrors according to the disclosed technology (representative view of the disclosed technology).

FIG. 2 is a view presented to be able to intuitively understand uniform light condensing based on flat mirrors and a sun tracking method for the light condensing, and FIG. 3 illustrates a method of cooling heat caused by the light condensing.

A description made with reference to FIG. 2 is as follows.

A photovoltaic panel is disposed with a light receiving surface thereof against the sun in a direction perpendicular to an incident direction of sunlight. That is, when a traveling direction of the sunlight is defined as the +z axis, a normal to the light receiving surface of the photovoltaic panel is a direction of the +z axis. Here, it should be noted that, for the convenience of calculation, it is best and efficient to dispose the photovoltaic panel in such a manner that, when a unit vector in the traveling direction of the sunlight is (0, 0, 1), a unit vector in a direction normal to the light receiving surface is (0, 0, 1). However, to prevent an attempt to avoid the scope of the claims of the disclosed technology, the unit vector in the direction normal to the light receiving surface of the photovoltaic panel is not limited to (0, 0, 1) as described above.

A plurality of flat mirrors are each fixed with a reflective surface facing the sun at adequately inclined angles in the directions of the x and y axes, and reflect incident sunlight to the photovoltaic panel as reflected light having a uniform intensity. The flat mirrors are each set to be different in size and direction according to a position, but they should be set to such an extent that the reflected light thereof fully covers the light receiving surface of the photovoltaic panel.

An additional description will be made to give grounds for defining the claims of the disclosed technology. An important aspect of the disclosed technology is that the photovoltaic panel is disposed with the light receiving surface thereof against the sun. This may be expressed as follows: when the unit vector in the traveling direction of the sunlight is (0, 0, 1), a z-axial component of the unit vector in a direction normal to the light receiving surface of the photovoltaic panel is positive. If not so (i.e. if the z-axial component of the unit vector in a direction normal to the light receiving surface of the photovoltaic panel is negative or zero, this means that the light receiving surface of the photovoltaic panel faces the sun or is parallel with the traveling direction of the sunlight), it is very difficult to raise light condensing of a uniform light intensity using the flat mirrors to a high level. This may be easily understood using plane geometry, and so detailed description thereof will be omitted.

With use of the condensing technique of the disclosed technology, it is possible to easily project the sunlight condensed to a uniform high level onto the photovoltaic panel having a large area. A degree of the light condensing may be easily adjusted by changing the number of flat mirrors. The degree of the light condensing (intensity of incident light) may be changed using, for instance, a method of sufficiently installing the number of flat mirrors in preparation for the winter season (or in morning and evening) and covering some of the flat mirrors with an opaque object or changing directions thereof when the intensity of the sunlight is too high in the summer season (or at noon). To this end, a separate means capable of changing the number of flat mirrors used in the light condensing may be further provided.

A frame fixes the photovoltaic panel and the plurality of flat mirrors such that a predetermined relationship is maintained with respect to the traveling direction of the sunlight.

The frame is also connected to a rotation mechanism that rotates in directions of two axes of a horizontal and vertical axis.

The rotation mechanism rotates the frame in the directions of two axes of a horizontal and vertical axis according to a change in position of the sun. Thereby, a predetermined relationship between the light condensing of the photovoltaic panel and the flat mirrors fixed to the frame is maintained.

A supporting structure supports weights of the constituent members (the frame, the rotation mechanism, the photovoltaic panel, and the flat mirrors), and mainly it is fixed to the ground, and may be designed to be movable.

An embodiment of a cooling method will be described with reference to FIG. 3.

When 24 flat mirrors are used as in the embodiment of FIG. 2, the intensity of the sunlight incident upon the photovoltaic panel may be increased 20 times more than that of a typical case. A temperature of the photovoltaic panel is rapidly raised by this strong incident light Particularly, crystalline silicon solar cells lose their function at a high temperature. Thus, in the case of at least the crystalline silicon solar cells, cooling is inevitably required.

As illustrated in FIG. 3, the most effective method is to dispose the photovoltaic panel in a housing having a transparent window capable of transmitting the sunlight and fill the remaining space inside the housing with a coolant (typically, water). It is more effective to force the coolant to flow into/out of the housing.

It may be considered that a circulator (FIGS. 7 and 9) is provided such that the coolant circulates in the housing even when the coolant does not flow into/out of the housing. Even if there is not the inflow/outflow and forcible circulation type of the coolant, when the mass of the coolant is sufficient, at least external surface of the photovoltaic panel may be cooled within the range of a fixed temperature by thermal convection of the coolant itself.

A predetermined relationship between the photovoltaic panel and the flat mirrors, a size, and an intensity of reflected light will be described in greater detail with reference to FIGS. 4, 5 and 6.

Figure 4:
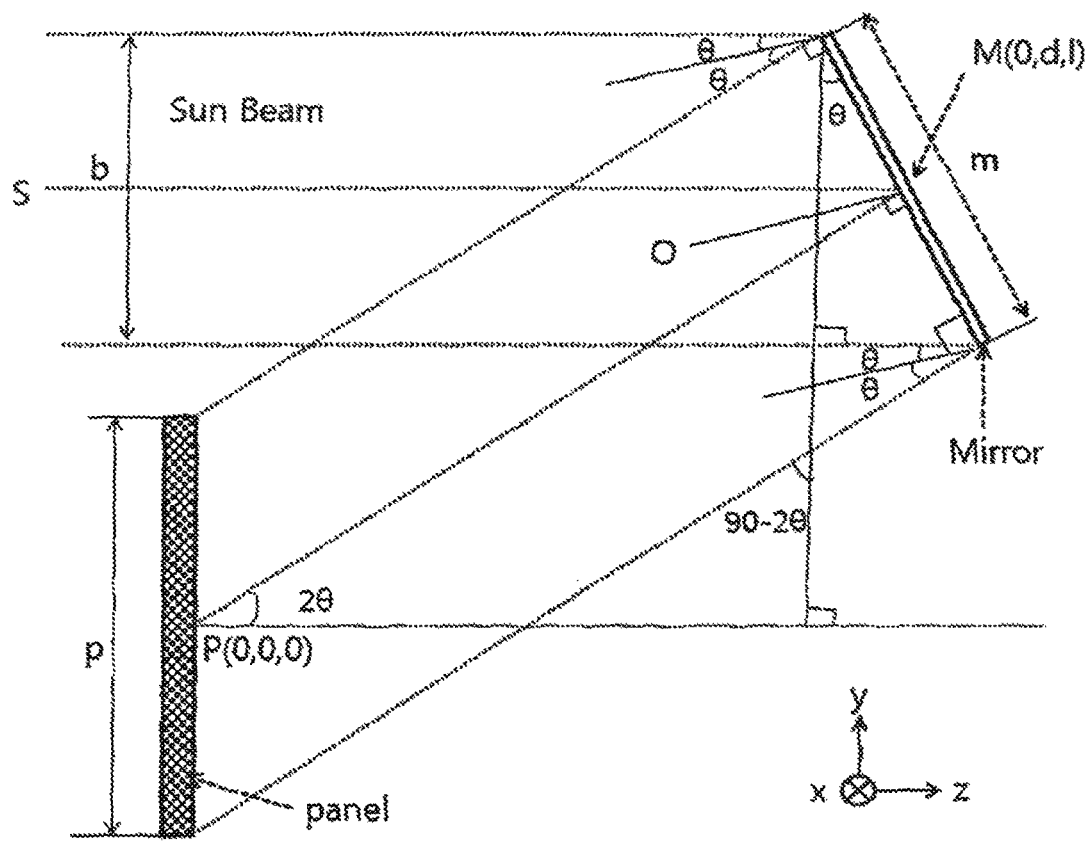
FIGS. 4 and 5 are views for describing a process of calculating light condensing capabilities of the flat mirrors and a relationship between magnitudes of the light condensing capabilities.

In FIG. 4, it is assumed that the traveling direction of the sunlight is the direction of the +z axis. It is assumed that the light receiving surface of the photovoltaic panel is directed in the direction of the +z axis (i.e., the light receiving surface of the photovoltaic panel is backed by the sun), and a center P of the light receiving surface is located at a point (0, 0, 0).

When a reflective surface of the flat mirror is directed in the direction of the +z axis, a center M of the reflective surface is located at a point (0, d, l), and an angle formed between a line segment PM and the z axis is $2\theta$, if the reflected light caused by the flat mirror covers the entire photovoltaic panel, the flat mirror should rotate about a straight line (y=d, z=l) parallel to the x axis by $\theta$ and be inclined. Hereinafter, this rotation is referred to as "$\theta_y$," regardless of a direction of a center axis of the rotation. Likewise, an angle of the flat mirror that should be inclined according to x-axial separation between the center of the light receiving surface of the photovoltaic panel and the center of the reflective surface of the flat mirror is referred to as "$\theta_x$".

Arranging the relationships at this time, relationships of $\tan 2\theta = d/l$, $(\cos 2\theta/\cos\theta) = m/p$, and $\cos \theta = b/m$ are formed (where p is the y-axial width of the photovoltaic panel, m is the y-axial width of the flat mirror, and b is the y-axial width of the sunlight that is reflected by the flat mirror and is incident upon the photovoltaic panel).

Thus, to fully cover the photovoltaic panel in which one side thereof has a length p with the reflected light, a length of the corresponding side of the flat mirror has a minimum value of $m = p \times (\cos 2\theta/\cos\theta)$. At that time, a width of the corresponding side of the incident sunlight is $b = p \times \cos 2\theta$.

The above relationships are equally applied to the flat mirror separated in the direction of the x axis.

Therefore, in the case of the reflected light of the flat mirror inclined by $\theta_x$ in the direction of the x axis and $\theta_y$ in the direction of the y axis, the sunlight incident upon an area of $b_x \times b_y = (p_x = \cos 2\theta_x) \times (p_y \times \cos 2\theta_y)$ is uniformly reflected to the photovoltaic panel having an area of $p_x \times p_y$, a light condensing capacity(G) of the flat mirror inclined by $(\theta_x, \theta_y)$ is given as follows.

Light condensing capacity(G) of a flat mirror inclined by $(\theta_x, \theta_y)$: $G = \cos 2\theta_x \times \cos 2\theta_y$.

The light condensing capability will be described below by way of a further embodied example.

When the center M of the reflective surface of a certain flat mirror is located at a point $(d_x, d_y, 1)$, and the center P of the light receiving surface of the photovoltaic panel is located at the point (0, 0, 0), the angle formed between the line segment PM and the z axis is $2\theta_y$ when viewed in the y-z plane, and $2\theta_x$ when viewed in the x-z plane. The following relationships are formed between them.

$\tan 2\theta_y = d_y/l$, $(\cos 2\theta_y/\cos\theta_y) = m_y/p_y$, and $\cos \theta_y = b_y/m_y$ $\tan 2\theta_x = d_x/l$, $(\cos 2\theta_x/\cos\theta_x) = m_x/p_x$, and $\cos \theta_x = b_x/m_x$ In the above numerical relationships, when the size (width×length) of the photovoltaic panel is $p_x \times p_y$, a necessary minimum size (width×length) of the flat mirror is $m_x \times m_y = p_x(\cos 2\theta_x/\cos\theta_x) \times p_y \times (\cos 2\theta_y/\cos \theta_y)$. Here, the sunlight that is reflected by the flat mirror and is uniformly incident upon the photovoltaic panel means that a quantity of light incident upon the rectangular plane $b_x \times b_y = (p_x \times \cos 2\theta_x) \times (p_y \times \cos 2\theta_y)$ perpendicular to the original traveling direction of the sunlight prior to reflection is uniformly projected to the area $p_x \times p_y$ of the photovoltaic panel.

Thus, the light condensing capacity of the flat mirror inclined by $(\theta_x, \theta_y)$ in this way is $(\cos 2\theta_x) \times (\cos 2\theta_y)$.

Figure 5:
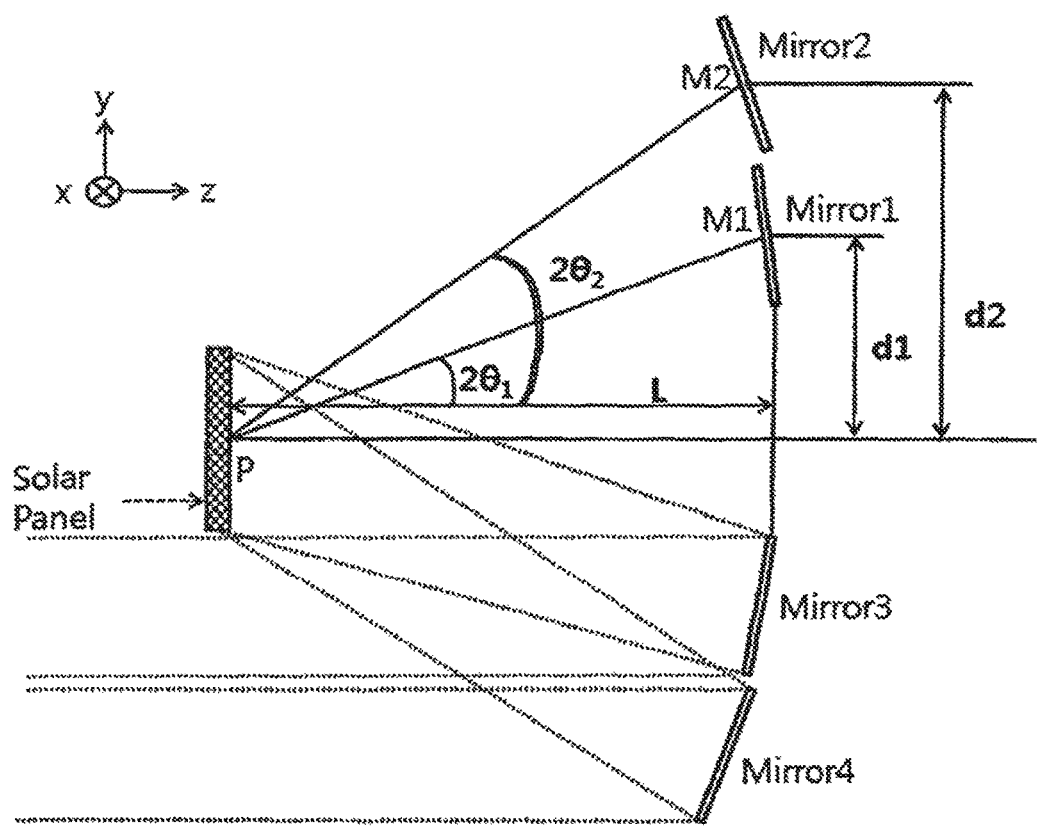
Figure 6:
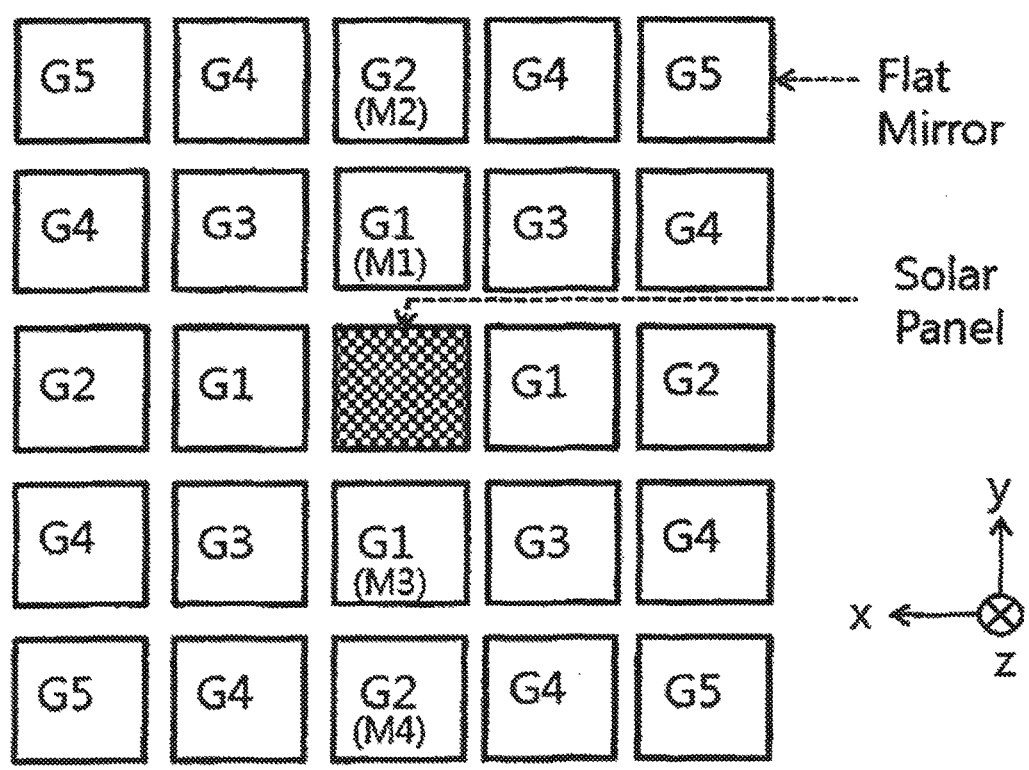
FIG. 6 is a view for describing the process of calculating the light condensing capabilities on the assumption that 24 flat mirrors of FIG. 2 are arrayed and have x-y symmetry.

Let's look at how much the 24 flat mirrors of FIG. 2 condense the quantity of the sunlight with reference to FIGS. 5 and 6. For the convenience of calculation, it is assumed that $p_x = p_y = p$, i.e. the photovoltaic panel has a square shape, and the flat mirrors are symmetrically arrayed in the x-y plane. Then, as in FIG. 6, the 24 flat mirrors will have five light condensing capabilities of G1 to G5.

In FIG. 5, when the setting conditions are d1=1.2 p, d2=2.4 p, and L=3 p, 5 p, and 0.5 p, each light condensing capability will be calculated as follows.

When L=5 p, $2\theta_{x1} = 2\theta_{y1} = 2\theta_1 = \arctan(d1/L) = \mathrm{actan}(1.2/5) = 13.50°$, and thus $\theta_1 = 6.75°$ $2\theta_{x2} = 2\theta_{y2} = 2\theta_2 = \arctan(d2/L) = \mathrm{actan}(2.4/5) = 25.64°$, and thus $\theta_2 = 12.82°$ Light condensing capacity G1: $\cos 2\theta_1 \times 1 = 0.972 \times 1 = 0.972$ (four), and thus one of $\theta_{x1}$ and $\theta_{y1}$ is 0°

Light condensing capacity G2: $\cos 2\theta_2 \times 1 = 0.902 \times 1 = 0.902$ (four), and thus one of $\theta_{x2}$ and $\theta_{y2}$ is 0°

Light condensing capacity G3: $\cos 2\theta_1 \times \cos 2\theta_1 = 0.972 \times 0.972 = 0.946$ (four)

Light condensing capacity G4: $\cos 2\theta_1 \times \cos 2\theta_2 = 0.972 \times 0.902 = 0.877$ (eight)

Light condensing capacity G5: $\cos 2\theta_1 \times \cos 2\theta_2 = 0.902 \times 0.902 = 0.813$ (four)

When L=5 p, the 24 flat mirrors condense the incident light by 21.542 times (under the condition of the symmetrical array).

When L=3 p,
$2\theta_{x1}=2\theta_{y1}=2\theta_1=\arctan(d1/L)=\operatorname{actan}(1.2/3)=21.80°$, and thus $\theta_1=10.90°$
$2\theta_{x2}=2\theta_{y2}=2\theta_2=\operatorname{actan}(d2/L)=\operatorname{actan}(2.4/3)=38.66°$, and thus $\theta_2=1933°$ Light condensing capacity G1: $\cos 2\theta_1 \times 1 = 0.928 \times 1 = 0.928$ (four), and thus one of $\theta_{x1}$ and $\theta_{y1}$ is 0°

Light condensing capacity G2: $\cos 2\theta_2 \times 1 = 0.781 \times 1 = 0.781$ (four), and thus one of $\theta_{x2}$ and $\theta_{y2}$ is 0°

Light condensing capacity G3: $\cos 2\theta_1 \times \cos 2\theta_1 = 0.928 \times 0.928 = 0.862$ (four)

Light condensing capacity G4: $\cos 2\theta_1 \times \cos 2\theta_2 = 0.928 \times 0.781 = 0.725$ (eight)

Light condensing capacity G5: $\cos 2\theta_2 \times \cos 2\theta_2 = 0.781 \times 0.781 = 0.610$ (four)

When L=3 p, the 24 flat mirrors condense the incident light by 18.525 times (under the condition of the symmetrical array).

When L=0.5 p,
$2\theta_{x1}=2\theta_{y1}=2\theta_1=\arctan(d1/L)=\operatorname{actan}(1.2/0.5)=6738°$, and thus $\theta_1=33.69°$
$2\theta_{x2}=2\theta_{y2}=2\theta_2=\arctan(d2/L)=\arctan(2.410.5)=78.23°$, and thus $\theta_2=39.12°$ Light condensing capacity G1: $\cos 2\theta_1 \times 1 = 0.385 \times 1 = 0.385$ (four), and thus one of $\theta_{x1}$ and $\theta_{y1}$ is 0°

Light condensing capacity G2: $\cos 2\theta_2 \times 1 = 0.204 \times 1 = 0.204$ (four), and thus one of $\theta_{x2}$ and $\theta_{y2}$ is 0°

Light condensing capacity G3: $\cos 2\theta_1 \times \cos 2\theta_1 = 0.385 \times 0.385 = 0.148$ (four)

Light condensing capacity G4: $\cos 2\theta_1 \times \cos 2\theta_2 = 0.385 \times 0.204 = 0.0784$ (eight)

Light condensing capacity G5: $\cos 2\theta_2 \times \cos 2\theta_2 = 0.204 \times 0.204 = 0.0416$ (four)

When L=0.5 p, the 24 flat mirrors condense the incident light by 3.740 times (under the condition of the symmetrical array).

Let's substitute the case of L=0.25 p. When L=0.25 p and the other conditions (magnitudes of d1 and d2) are the same as the above examples, $\theta_1=39.12°$, $\theta_2=42.03°$, the light condensing capacities of G1 to G5 are 0.204, 0.104, 0.0416, 0.0211, and 0.0107 respectively, and the total light condensing capacity of the 24 flat mirrors becomes 1.609.

When L has an infinite magnitude (both $\theta_1$ and $\theta_2$ converge on 0°), all the light condensing capabilities of G1 to G5 become 1, and the total light condensing capability caused by the 24 flat mirrors of FIGS. 2 and 6 becomes 24.

However, it is very inefficient to greatly set L in order to increase the total light condensing capability. This is because, when the magnitude of L exceeds 5 p (where 5 p is approximately similar to a length and a width of a reflector structure which the 24 flat mirrors of FIG. 2 constitute), a volume (strictly speaking, a z-axial length) of a structure of the photovoltaic power generation system is increased, whereas the total light condensing capability is not particularly increased. It is easier and more effective to reduce the distance L up to a plane formed by the centers of the reflective surfaces of the flat mirrors as small as possible and increase the number of flat mirrors in return. (Here, the centers of the reflective surfaces of the flat mirrors may be approximately considered to be present on the same plane. However, this does not mean that the reflective surfaces of the flat mirrors should be strictly present on the same plane.)

The number of flat mirrors may be easily increased by further disposing another 24 flat mirrors around the flat mirrors of FIG. 2. That is, in FIG. 2, flat mirrors surround the flat mirrors in duplicate (8+16). If necessary, 24 new flat mirrors may be further disposed along a third circumferential line.

Moreover, all the flat mirrors always project uniform reflected light to the light receiving surface of the photovoltaic panel, and thus uniformly condensed sunlight is always projected to the light receiving surface of the photovoltaic panel regardless of a number and disposed positions of the flat mirrors that are used.

Under the above conditions (the square photovoltaic panel (p×p), d1=1.2 p, and d2=2.4 p), when L=α p and 0.1≤α≤10, the light condensing capability of the 24 flat mirrors of FIG. 6 is calculated and given in Table 1 below and a graph of FIG. 10d.

Here, it has already been described that there are the following relationships:
G1=$\cos 2\theta_1$, G2=$\cos 2\theta_2$, G3=$(\cos 2\theta_1)^2$, G4=$(\cos 2\theta_1) \times (\cos 2\theta_2)$, and G5=$(\cos 2\theta_2)^2$, and
$2\theta_1=\arctan(d1/L)$ and $2\theta_2=\operatorname{actan}(d2/L)$

TABLE 1

| α | $\theta_1$ (radian) | $\theta_2$ (radian) | Light condensing capability (G) = 4 × ( G1 + G2 + G3 + G5) + 8 × G4 |
|---|---|---|---|
| 0.1 | 0.743827547 | 0.764576874 | 0.560880543 |
| 0.2 | 0.702823825 | 0.743827547 | 1.234692926 |
| 0.3 | 0.662908832 | 0.723220666 | 2.003776753 |
| 0.4 | 0.624522886 | 0.702823825 | 2.846515317 |
| 0.5 | 0.588002604 | 0.682700469 | 3.739935433 |
| 0.6 | 0.553574359 | 0.662908832 | 4.662012831 |
| 0.7 | 0.521360939 | 0.643501109 | 5.593299241 |
| 0.8 | 0.491396862 | 0.624522886 | 6.517773911 |
| 0.9 | 0.463647609 | 0.606012828 | 7.423036971 |
| 1 | 0.438029025 | 0.588002604 | 8.300057529 |
| 2 | 0.27020975 | 0.438029025 | 14.96285879 |
| 3 | 0.190253189 | 0.337370471 | 18.52483016 |
| 4 | 0.145728397 | 0.27020975 | 20.44281219 |
| 5 | 0.11777249 | 0.223759988 | 21.54180158 |
| 6 | 0.09869778 | 0.190253189 | 22.21422958 |
| 7 | 0.084889137 | 0.165148677 | 22.65009566 |
| 8 | 0.074444974 | 0.145728397 | 22.94658963 |
| 9 | 0.066275766 | 0.130301196 | 23.15649445 |
| 10 | 0.059714463 | 0.11777249 | 23.31010913 |

Figure 10A:
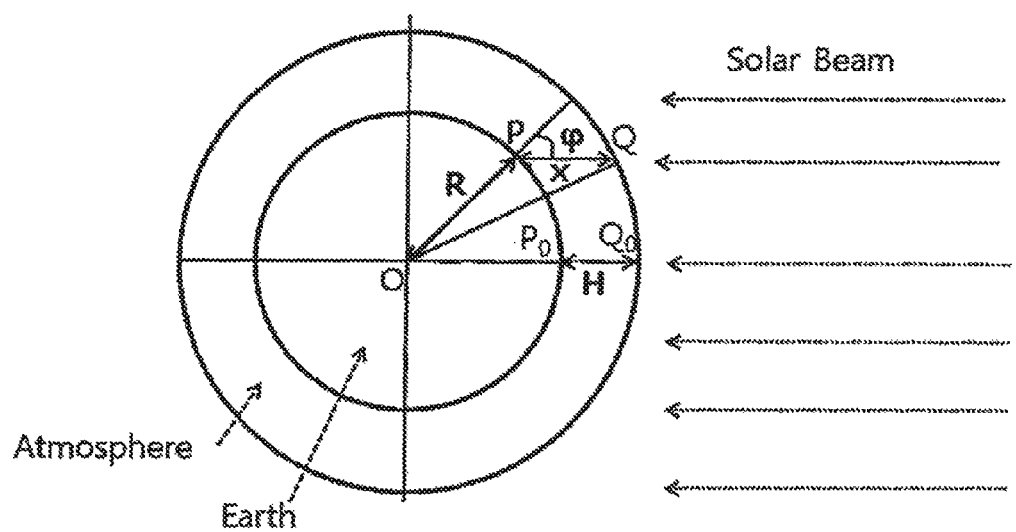
FIGS. 10a, 10b and 10c are views for describing calculation of an atmospheric layer passing distance and attenuation of the intensity of sunlight according to a change in altitude of the sun.
Figure 10B:
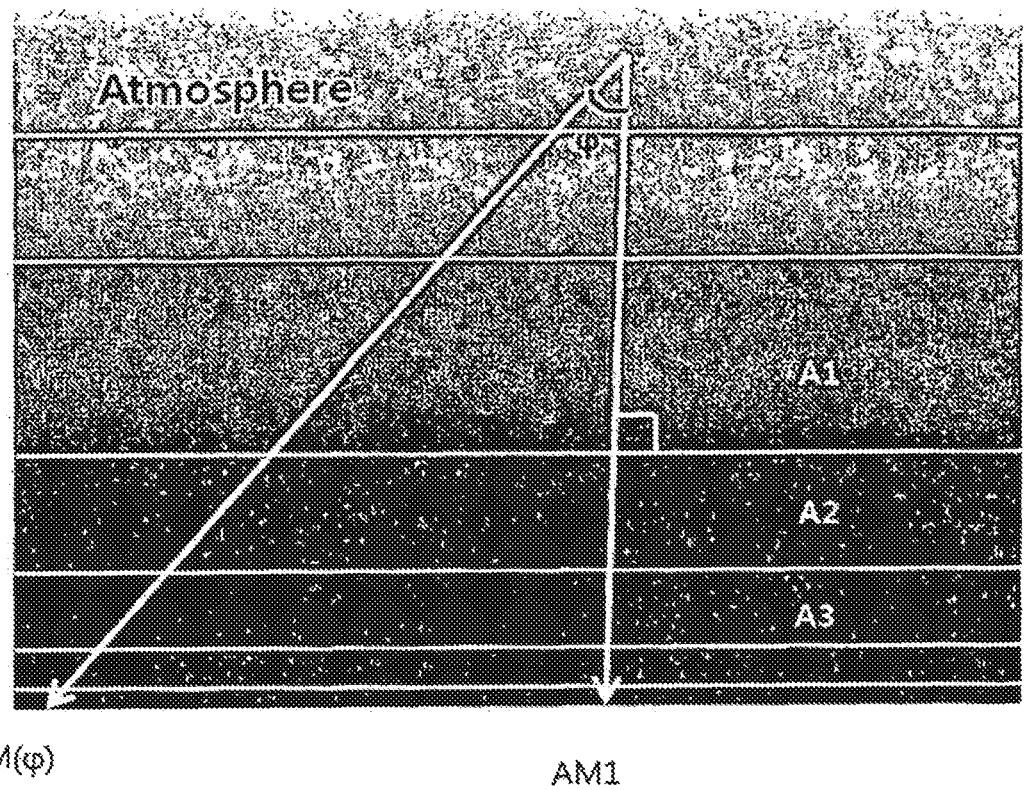
Figure 10C:
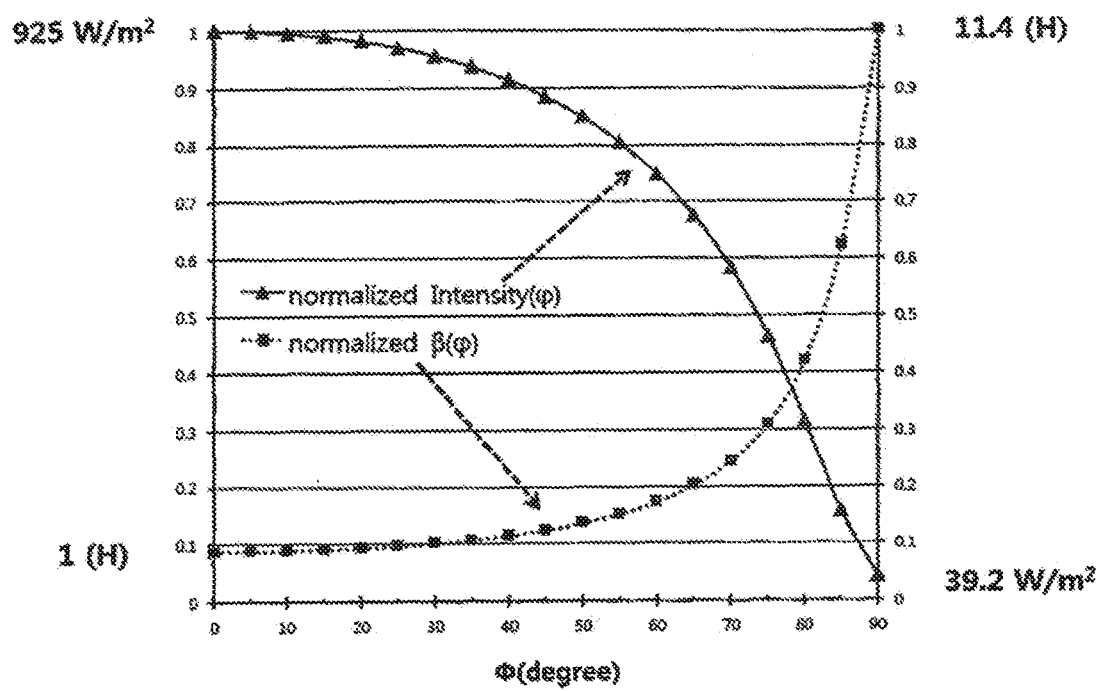
Figure 10D:
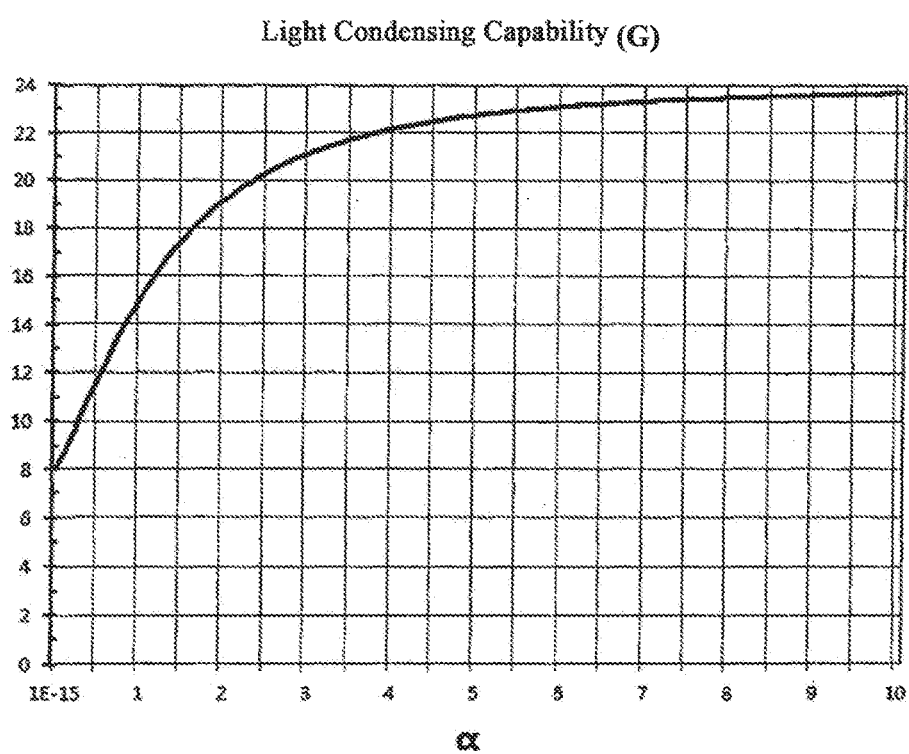
FIG. 10d is a graph illustrating results of calculating a change in light condensing capability according to a change in distance between the photovoltaic panel and a structure in which the flat mirrors are arranged.

Anyone can understand that it is reasonable and realistic to set α within a range between 1 and 5 from the graph of FIG. 10d.

It has already described that it is not necessary for all the reflective surfaces of the flat mirrors to be present on the same plane. Rather, it is better for the reflective surfaces of the flat mirrors to be alternately disposed in two or more virtual planes that are property separated. This is because a wind smoothly flows into an empty space between the flat mirrors according this configuration, and the flat mirrors and the frame may better withstand a strong wind. The reason the sufficient distances such as d1=1.2 p and d2=2.4 p are set between the flat mirrors in the previous embodiment is to consider that an influence caused by the wind should be reduced. (In fact, a mom important reason than this is that the flat mirrors should be set to have a margin to a sufficient extent more than a necessary minimum width in order to overcome an array error as will be described below.)

It is good that a width m of one side of the flat mirror is slightly greater than a required minimum magnitude of p×(cos 2θ/cosθ). This is because the reflected light can always fully cover the light receiving surface of the photovoltaic panel in spite of an array error of the flat mirrors, an array error of the photovoltaic panel, an operation error of the rotation mechanism, and so on.

The sunlight condensing using the flat mirrors has been sufficiently described hereby.

Hereinafter, the cooling method will be described in greater detail.

As described above, with use of the 24 flat mirrors of FIG. 2, the sunlight may be condensed by 0 to 24 times according to the z-axial distance L between the photovoltaic panel and the flat mirrors (it is practically reasonable to condense the sunlight by 8 to 21 times). In this case, particularly in the crystalline silicon solar cells, it is impossible to normally produce the electric power without cooling due to a rise in temperature caused by the light condensing.

It is a well-known phenomenon that power production efficiency increases when the photovoltaic panel is cooled. It is reported that, even when light is not condensed, a temperature of crystalline silicon photovoltaic modules increases up to 60° C. to 70° C. in a fine weather in the middle of summer, photoelectric conversion efficiency is lowered by a certain rate (approximately by 0.5%) whenever the temperature increase in units of 1° C., and a function is stopped when the temperature is more than 100° C. When the incident sunlight is condensed by more than 10 times as in the embodiment of the disclosed technology, it is essential to cool the photovoltaic panel, and particularly the crystalline silicon photovoltaic panel, and it is necessary to significantly increase cooling efficiency although a cost is slightly increased.

Another aspect of the disclosed technology is based on the above fact.

An exemplary embodiment of the cooling method of the disclosed technology will be described with reference to FIG. 7.

The photovoltaic panel is removably installed in a sealed housing by a holder. A transparent window is provided to be removable from the housing in front of the light receiving surface of the photovoltaic panel such that the sunlight reflected by the flat mirrors may be transmitted (the reason the photovoltaic panel and the window are removably designed is that maintenance such as replacement or repair of parts, removal of impurities such as scale or a precipitate, and so on is convenient).

The housing is coupled with the window, and thereby the interior thereof is sealed.

The housing is provided with inlet and outlet valves for inflow and outflow of a coolant (for example, water). Additional holes may also be drilled in the housing so as to guide two or more power cables connected to the photovoltaic panel and various electric wires provided for a coolant circulator, and various sensors such as a temperature sensor and/or for a controller which may be added in the housing. It is natural that the housing is entirely sealed such that the coolant does not leak out.

The reason the water is used as the coolant is that the water is inexpensive, can be easily obtained, is present in quantity, is not harmful to an environment, and is one of materials having greatest specific heat. What the great specific heat means is that an effect of inhibiting a rise in temperature of the photovoltaic panel is great (a conventional air cooling method is largely inadequate in cooling efficiency). In the embodiment of the disclosed technology, since the water acting as the coolant is in direct contact with both surfaces of the photovoltaic panel, the cooling efficiency is remarkably raised compared to the conventional water cooling method of cooling only the rear surface of the photovoltaic panel.

Of course, close attention should be paid to insulation since the photovoltaic panel is immersed in water, and an additional cost will be required. However, a current technical level can sufficiently overcome this drawback. Although the cost added to this is considered, the cooling method of the disclosed technology will have a sufficient economical benefit.

All of the photovoltaic panel, terminals, and electric wires are surrounded with insulators. Particularly, the insulator covering the light receiving surface should have excellent permeability (especially with respect to light having a wavelength band contributing to photoelectric conversion). The insulators must have an excellent dielectric characteristic, and preferably have as high a heat transfer efficiency as possible. The insulators are preferably as thin as possible to increase the heat transfer efficiency, but they should have thicknesses such as not to deteriorate the dielectric characteristic and durability.

Internal surfaces of the window and the light receiving surface of the photovoltaic panel are disposed as closely as possible. This is intended to reduce a quantity of the sunlight absorbed by the coolant or the refrigerant). However, avoid disposing the internal surfaces of the window and the light receiving surface of the photovoltaic panel so closely that it is hard for the coolant or the refrigerant adjacent to the light receiving surface of the photovoltaic panel to cause convection.

A replacement period of the refrigerant will be calculated on the assumption that the coolant is water. When the area of the light receiving surface of the photovoltaic panel is A, an area of the window of the housing should be greater than A. It is firstly assumed that a cross-sectional area of the housing including the window is A. When an internal thickness of the housing is D, a volume of the refrigerant contained in the housing is AD. A volume occupied by, for instance, the photovoltaic panel may be ignored. Assume that it takes time t for the temperature of the coolant to rise from 20° C. to 50° C. ($\Delta T=30K$), the following expression is formed.

$$\Delta Q = AD\rho\sigma\Delta T = GI_0 At$$

The above expression means that the quantity of energy required to raise the temperature of the water in the housing by 30° C. is equal to the quantity of energy introduced by the reflected light incident upon the photovoltaic panel.

Here, $\rho=1$ g/cm$^3$ (the density of water), $\sigma=42$ J/gK (the specific heat of water), $GI_0$ indicates the intensity of the reflected light incident upon the photovoltaic panel, and G indicates the light condensing capacity caused by the 24 flat mirrors of FIG. 2 and its magnitude has a value between 0 and 24 (practically between 8 and 21) as described above. $I_0$ is the intensity of sunlight, and applying the greatest value on the Earth's surface of AM1=925 W/m$^2$ (intensity of sunlight radiating from the sun at the zenith on a fine day) is sufficient (the above condition is the worst condition in regard to the temperature rise).

Arranging the above expression by substituting the above numerical values for the above expression, a relationship of $t=(D/G)\times(1362)$(sec/cm) [sec] is formed.

It can be seen from FIG. 10d that the worst practical situation (from the aspect of the temperature rise) is roughly when G=21. Substituting this value, $t=(D\times64.9)$(sec/cm) [sec].

The above expression means that, when the internal width D of the housing is 10 cm, it takes 649 seconds (more than 10 minutes) to raise the temperature by 30° C. When D is designed to be 60 cm, this means that the temperature of the refrigerant may be maintained within a maximum setting value (50° C.) without replacing the refrigerant for at least one hour.

In consideration of the weight of the housing, maintenance expenses, and so on, it can be easily selected by a user whether to design D to be small and to frequently replace the refrigerant or whether to design D to be great and to rarely replace the refrigerant. It is not difficult to maintain the temperature of the refrigerant in the housing within a very small fixed range by forcing a proper quantity of refrigerant to flow at proper periods or by installing a sensor to control a circulating rate of the refrigerant.

It has previously been described that the housing is further provided with the inlet and outlet valves for inflow and outflow of the coolant. Further, it has previously been mentioned that the circulator for forcibly circulating the coolant in the housing may be further provided. The circulator may be implemented by a rotating fan or a jet device. The circulator is useful to prevent the temperature of the refrigerant around the light receiving surface of the photovoltaic panel from rising higher than the temperature of the refrigerant at the other portions. However, the circulator is not essentially required, and may be replaced with heat distribution caused by the thermal convection of the refrigerant.

Next, it will be calculated whether the photovoltaic panel immersed in the refrigerant discharges a calorific value, which corresponds to a calorific value obtained by receiving the condensed sunlight, to the coolant. FIG. 11 illustrates a general structure of the photovoltaic module using crystalline silicon.

Assuming that thermal conductivity of a sealing material is $k1$, a thickness of the sealing member up to a front transparent panel is $d1$, thermal conductivity of the front transparent panel is $k2$, and a thickness of the front transparent panel is $d2$, thermal resistance of the sealing material toward a front surface is $R1=d1/k1$, and thermal resistance of the front transparent panel is $R2=d2/k2$. Therefore, the total thermal resistance of a path ranging from a solar cell element to the refrigerant located at the front surface is $R=R1+R2=d1/k2+d2/k2$, and a transferred calorific value is obtained as $Q=A(\Delta T)t/R$ (where $\Delta T$ is the temperature difference between the refrigerant and a surface of the solar cell element, and t is the time for which the calorific value is discharged).

Assuming that $d1=2$ mm, $d2=5$ mm, $k1=1$ W/mK (resin of a type having very high thermal conductivity), $k2=0.8$ W/mK (general glass), and $\Delta T=1K$ (assuming that the temperature of the solar cell element is 60° C., and the temperature of the refrigerant is 50° C.), the total thermal resistance is $R=8.25\times10^{-3}$ (m²K/W), $(\Delta Q)/tA=(\Delta T)/R=1,212$ W/m². That is, this means that the calorific value may be discharged toward the front surface with power of 1,212 W per 1 m². Since the side of the rear surface of the photovoltaic module does not need to be transparent, the thermal resistance toward the rear surface may be designed to be even smaller than that toward the front surface (for example, the rear panel may be formed of a metal plate having even higher thermal conductivity than plate glass most frequently used as the front transparent panel).

Figure 11A:
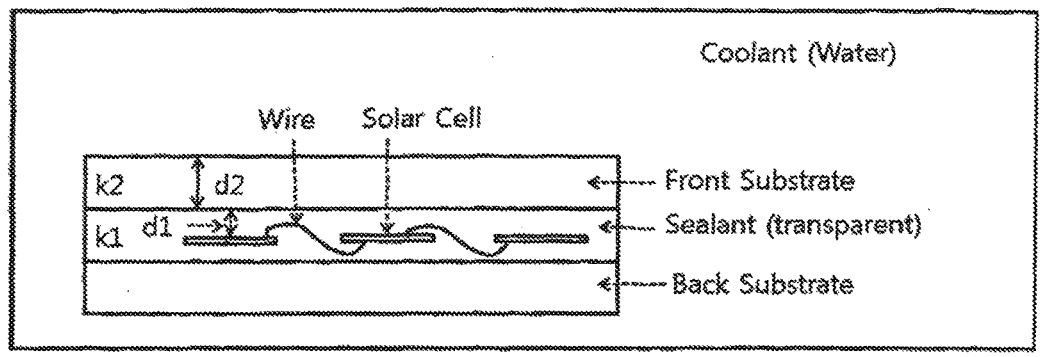
FIGS. 11a and 11b are views for describing a calorific value discharging capability of a photovoltaic module immersed in refrigerant.

Thus, it can be found that a heat discharging capability is at least more than $2\times1,212=2,424$ W/m² by means of the embodiment of FIG. 11a and designation of the variables ($d1$, $d2$, $k1$, $k2$, $\Delta T$) in consideration of both the front and rear surface sides. The total thermal resistance R may be made smaller by reducing $d1$ and $d2$ and increasing $k1$ and $k2$ (i.e., the heat discharging capability toward the refrigerant may be made greater).

Further, when $\Delta T$ is great due to a low temperature of the refrigerant, that much more calorific value is better discharged.

Figure 11B:
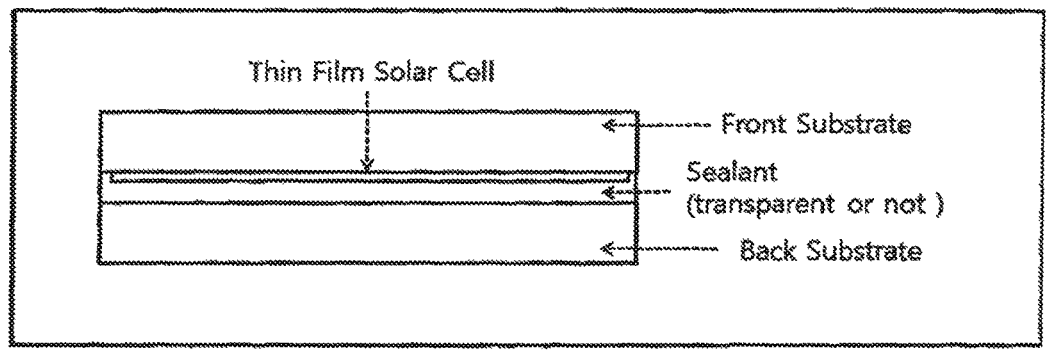

FIG. 11b illustrates a general structure of a thin film photovoltaic module (formed of amorphous silicon, CdTe, CIGS, etc.). In comparison with the case of FIG. 11a, the total thermal resistance may be further reduced since the transparent resin located at the front surface is not required. Unlike the case of FIG. 11a, in the case of FIG. 11b, since a sealing material (generally a polymeric resin) may be opaque, the fact that a width of selection for greatly setting thermal conductivity k is wider also has a favorable effect.

Meanwhile, since a polymeric resin in which the thermal conductivity k reaches 7 W/mK is commercially available, it is not difficult to reduce the total thermal resistance compared to the assumption of the above embodiment in terms of the current technical level.

It has been sufficiently considered that the photovoltaic module immersed in the refrigerant may discharge the calorific value equivalent to the calorific value received from the condensed sunlight to the refrigerant.

To minimize absorption of the sunlight caused by the refrigerant, the light receiving surface of the photovoltaic panel and the internal surface of the window are disposed as close as possible. However, the distance between the two surfaces should not be so close as to hinder the convection of the refrigerant because the accumulated thermal energy in the vicinity of the light receiving surface of the photovoltaic panel should be dissipated as soon as possible. This is because the convection of the refrigerant whose temperature rises in the vicinity of the light receiving surface of the photovoltaic panel must be sufficiently allowed to take place.

A small quantity of anti-foaming agent for inhibiting generation of air bubbles may be added to the refrigerant. This is because, when the air bubbles floating in the refrigerant are increased, the path of the sunlight incident upon the photovoltaic panel is disturbed.

When a temperature is below zero, an anti-freezing solution may be mixed with the refrigerant at a certain ratio. However, considering problems such as an adverse effect on the environment, an increase in corrosion of the photovoltaic power generation system, addition expenses required for purchase and management of the anti-freezing solution, and so on, pure water is most preferably used as the refrigerant as far as possible. The refrigerant is seldom frozen during the daytime (the period for which the electric power is produced) on a fine day on which the sun shines due to heat caused by the light condensing of the flat mirrors. A problem occurring when the refrigerant is frozen is that the path of the sunlight incident upon the photovoltaic panel is disturbed by ice in the morning when the temperature is below zero, and the power production efficiency is reduced. The more serious problem is that a pressure increases inside the housing, the valves and/or hoses due to volume expansion of the coolant (water) occurring in freezing can cause mechanical breakdown of the constituents. This problem mainly takes place for a time when the power production is stopped (the operation is stopped), i.e. when the sun does not shine (at night or on a cloudy day).

However, even when the refrigerant is the pure water, it is difficult to say that no method of preventing the mechanical breakdown is present. If the refrigerant inside the systems such as the housing, the valves, and inflow/outflow pipes for the coolant is completely drained at night when the temperature is below zero or on a sub-zero rainy day when there is little possibility of the sun shining, and the refrigerant is filled immediately before the sun begins to shine to start power generation, the above-mentioned problems such as the problem that the refrigerant is frozen to delay operation for the photovoltaic power generation and the mechanical breakdown caused by the volume expansion may be solved. Thin ice covered on the window will quickly be melted due to the heat caused by the light condensing.

Figure 7:
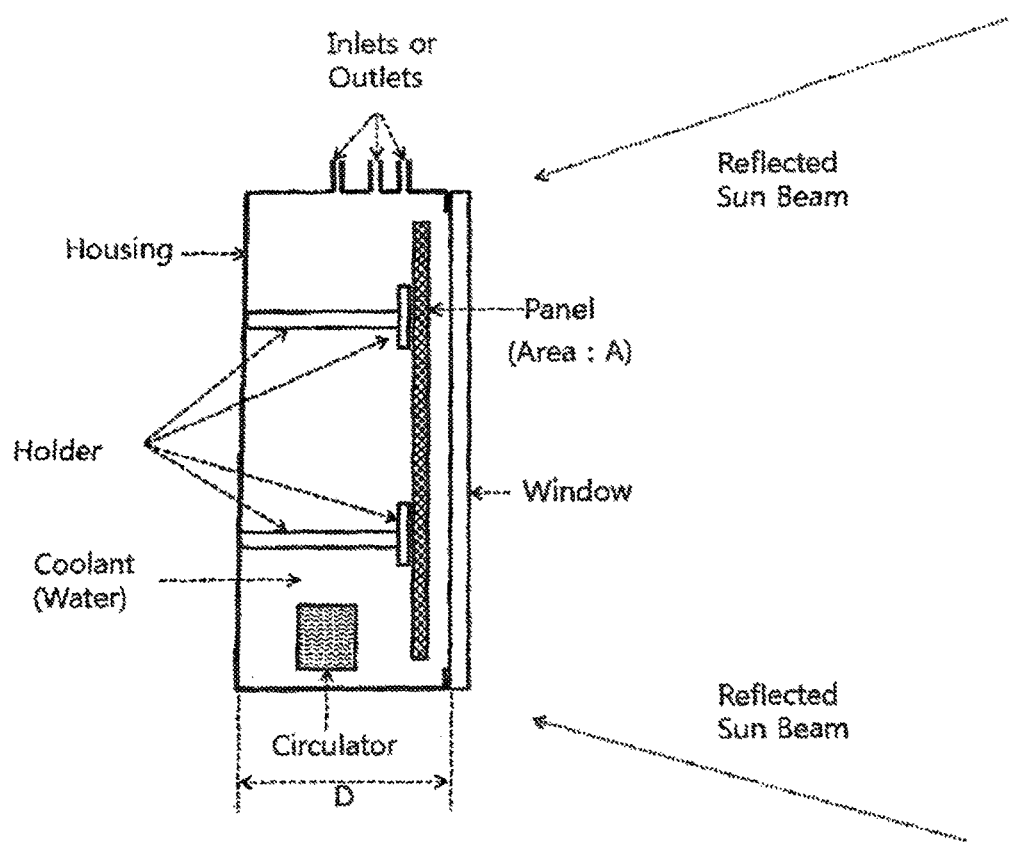
FIG. 7 is a view for describing a cooling housing of the disclosed technology in detail.

In addition, since the photovoltaic panel is installed in and protected by the housing as in FIG. 7, the photovoltaic panel may be made thinner (within a range in which mechanical strength is allowed), and deterioration (mainly attributed to exposure to short wavelength radiation such as ultraviolet and temperature variation) occurring when the photovoltaic panel is exposed to the air in the past may be reduced.

Another embodiment associated with FIG. 2 will be described with reference to FIG. 8.

Figure 8:
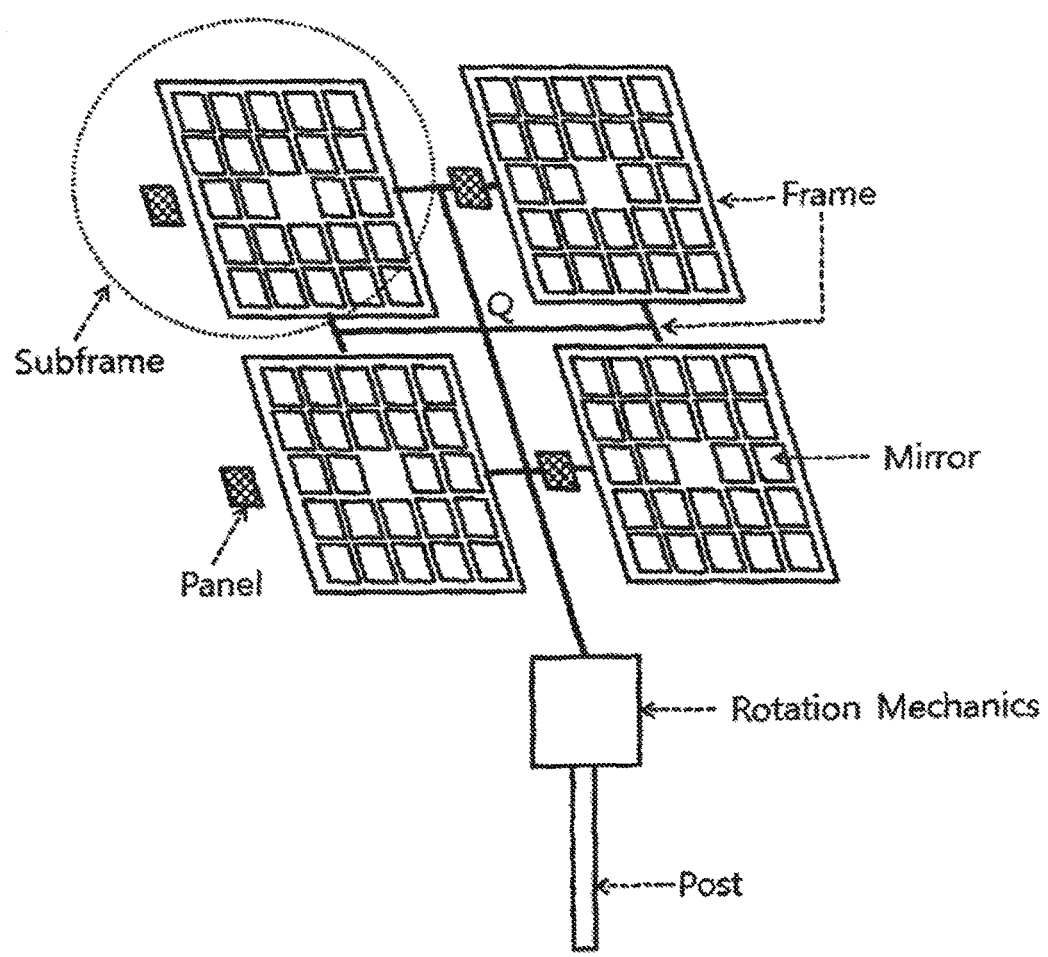
FIG. 8 is a view for presenting a frame other than that of the embodiment of FIG. 2 and describing the center (Q) of gravity of the frame.

In FIG. 8, one photovoltaic panel and 24 flat mirrors are arrayed in each of four subframes illustrated. In this case, unlike those illustrated in FIG. 2, a rotation mechanism is most preferably connected to a center Q of gravity of the subframes. The reason is that, when the rotation mechanism is connected to the center Q of gravity of all of the subframes, a driving force required to rotate the subframes is minimized, and a mechanical fatigue caused by gravity or wind may be minimized. Even in the case of FIG. 2, it is natural that the center of gravity of the frame is more preferably found out and connected to the rotation mechanism Further, it is natural that shapes of the subframes should be designed so as not to disturb the path of the sunlight.

Figure 9:
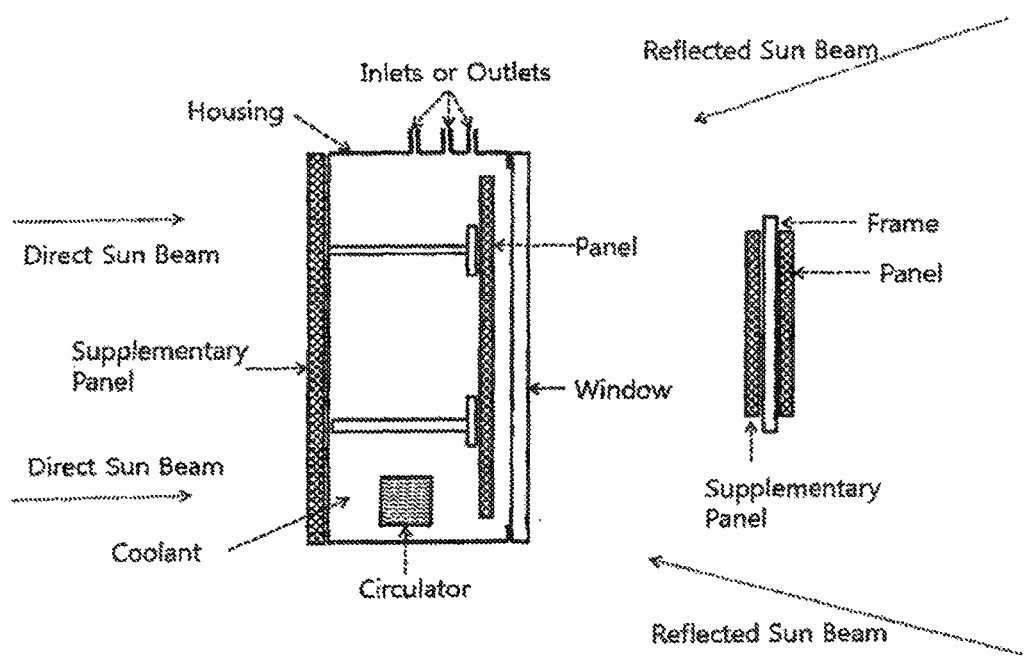
FIG. 9 is a view for presenting a supplementary panel.

As illustrated in FIG. 9, the rear surface of the photovoltaic panel (or the cooling housing) receiving the sunlight that is reflected and condensed by the flat mirrors may be further provided with a separate supplementary panel. This is because the previously provided rotation mechanism may be used, and the sunlight incident upon the photovoltaic panel or the rear surface of the housing are uselessly wasted and instead causes only a rise in temperature (in the case of the above embodiment, as much energy is dissipated to the outside in the form of electric power as a quantity that at least corresponds to conversion efficiency of the supplementary panel).

Although not illustrated, an optical filter layer may be provided on the surface(s) of the window and/or the flat mirrors to filter light of a wavelength band that does not contribute to the photoelectric conversion. This has an additional effect of inhibiting the temperature rise and the deterioration of, for instance, the photovoltaic panel. Such a band pass optical filter is most preferably attached to the flat mirrors, because the maximum value of the intensity of the sunlight received by the flat mirrors is AM1 (925 W/m$^2$), and thus deterioration of the optical filter caused by heat or strong light may be minimized. In this case, however, an amount of required optical filters increases, which is unfavorable in terms of a price. This is opposed to the case in which the optical filter is attached to the window. The optical filter may be attached to the light receiving surface of the photovoltaic panel. However, this is the worst method, because this means that a calorific value is accumulated on the object (optical filter) that is in direct contact with the light receiving surface of the photovoltaic panel. Further, a material (e.g. a dye) performing a function similar to that of the optical filter may be mixed with the coolant in the housing. Use of the optical filter may be selected independently or in combination of two or more of the four cases (the flat mirror, the window, the photovoltaic panel, and the coolant) according to its position.

The flat mirrors should have high reflectance, low transmittance, and low absorptance with respect to the incident light (particularly, the incident light of the wavelength band contributing to the photoelectric conversion), and the window should have low reflectance, high transmittance, and low absorptance.

The following will be added to the technical idea of the disclosed technology.

1. The embodiment of the disclosed technology is described keeping in mind the crystalline silicon solar cells that are commercially sold. However, it is apparent that the embodiment of the disclosed technology may also be applied to other photovoltaic panels made up of thin film solar cells formed of amorphous silicon, CIS, CIGS, and CdTe, compound multi-junction solar cells formed of a III-V group or II-VI group element, solar cells having a quantum structure, dye-sensitized solar cells, organic thin film solar cells, Plasmon solar cells, or the like.

2. The cooling system of the disclosed technology is expected to be essentially required for silicon solar cells. However, when such a photovoltaic panel in which the photoelectric conversion efficiency is not particularly reduced in spite of the temperature rise, the cooling system presented in the embodiment of the prevent invention is not essentially required.

3. The photovoltaic power generation method using the light condensing and the rotation mechanism of the disclosed technology is based on the general principle of the photoelectric effect in which the produced electric current (i.e., electric power) is proportional to the quantity (or the intensity) of incident light and which was discovered by Einstein (since an output voltage is primarily determined in proportion to the number of series connections of unit cells in the photovoltaic panel regardless of the intensity of the incident sunlight, an output voltage and an output current which are output from the photovoltaic panel are in direct proportion). However, when the quantity (intensity) of the incident light continues to increase, the photovoltaic panel does not continue to continuously increase a value of the output current (electric power). It is probably predicted that a phenomenon that, when the quantity (intensity) of the incident light is equal to or more than a predetermined value, although the quantity (intensity) of the incident light continues to increase, the output current (electric power) of the photovoltaic panel converges to a predetermined value (saturated), or a rate of increment dp/di is reduced occurs (where "p" is the electric power, and " " is the intensity of light). However, an aspect of a value of saturation of the electric current (electric power) or a rate of change (dp/di) of the output current according to the intensity of light will depend on a type of a semiconductor material constituting the photovoltaic panel, a thickness of a semiconductor layer, a doping concentration, a thickness of a depletion layer, a stacked structure or a method of manufacturing the stacked structure. The simplest method is to increase the thickness of the semiconductor layer (an active layer or a functional layer). The expression " . . . incident radiation may be absorbed by functional layers. At this time, a thickness of each functional layer determines a ratio of radiated power absorbed in the functional layers, . . . " is given in Korean Unexamined Patent Application Publication No. 10-2007-0004928 A (equivalent to WO 2005-096394 A1), lines 10 to 12. In this way, it is disclosed that, as the thickness of the semiconductor layer (functional layer) increases, more light is absorbed, and more electric current is generated. As described above, the prediction of the present inventor that the aspect of the value of saturation of the electric power or the rate of change (dp/di) of the output current is associated with the thickness of the semiconductor layer is supported.

4. The technique adapted to be able to increase the value of saturation of the electric current (electric power) of the photovoltaic panel to maintain the value of dp/di to be high according to the increase of the aforementioned intensity i of light will be a meaningful and useful invention by itself. However, if such an invention is made, this invention obtains a motive of the invention from the technical idea published by the disclosed technology, and thus should be recognized to be an improved invention (use invention) in relation with the disclosed technology.

5. As described in item 3, as the intensity of light increases, the electric power produced by the photovoltaic panel will be finally saturated or the rate of increment will slow. However, in the case of at least the silicon photovoltaic panel that is commercially available, the value of dp/di has a fixed value until the intensity of light at least reaches a magnitude of 1,000 W/m$^2$. This point definitely supports the utility of the disclosed technology. This is because, if the disclosed technology is used even when the intensity of the sunlight is weak (when an altitude of the sun is low, the morning and the late afternoon of the day, the winter, a high-latitude area, a cloudy or foggy weather, etc.), the sunlight may always be projected onto the light receiving surface of the photovoltaic panel with the intensity of 1 KW/m$^2$ (this value is slightly higher than AM1; 925 W/m$^2$) that is the intensity of the sunlight when the sun is at the zenith, i.e. when the sunlight is vertically projected to the Earth's surface). That is, when the photovoltaic panel having the same area is used, although the number of flat mirrors and the land area required for the photovoltaic power generation plant are increased, the electric power may be produced even in an existing environment in which the intensity of the sunlight is weak and the production of the electric power was given up at the time of the disclosed technology being applied. This means that the photovoltaic power generation project is possible in Mongolia, Siberia, Canada, etc. where affordable lands that may be used for the photovoltaic power generation are available but are short of an amount of solar radiation of the sunlight due to high latitudes, and are estimated that the photovoltaic power generation project is not a competitive project.

6. Although not greatly relevant to the scope of the claims of the disclosed technology, it is predicted using a very simplified model how the intensity of the sunlight is changed according to a change in altitude of the sun (see FIGS. 10a, 10b, and 10c).

As illustrated in FIG. 10a, the reason the intensity of the sunlight is reduced in proportion to the altitude of the sun is that the sunlight is blocked (absorbed, reflected, or scattered) by particles such as molecules or dust in the air. The more blocking particles (gas and liquid molecules, solid particles) present in the traveling path of the sunlight, the lower the intensity of the sunlight. This means that, as the traveling path of the sunlight in the air lengthens, the intensity of the sunlight is reduced.

As in FIG. 10a, a point $P_0$ which is located on the Earth's surface and which the sunlight reaches in a vertical direction (zenith) and a point P which is located on the Earth's surface and which the sunlight reaches at an angle $\phi$ inclined with respect to the perpendicular are compared (a relationship of the altitude of the sun=90−$\phi$ is formed).

The sunlight cast to $P_0$ moves in the air by H (the thickness of the atmosphere).

Assuming that a distance at which the sunlight cast to P moves in the air is x (a distance between P and Q), $(R+H)^2=R^2+2-2R\times\cos(180-\phi)$ according to the relationship of the second law of cosines at a triangle OPQ. When this formula is arranged as the quadratic equation of x, then $x^2+2(R\cos\phi)x-(H^2+2RH)=0$.

Here, R is the radius of the Earth, H is the thickness of the atmosphere, O is the center of the Earth, Q and $Q_0$ are the (imaginary) points at which the sunlight traveling to P and the sunlight traveling to $P_0$ meet the outermost shell of the air. Further, it is assumed that the Earth is a complete sphere, and the sunlight is not refracted when traveling in the air. Obtaining a physically meaningful solution of the quadratic equation, $x(\phi)=(R^2\cos^2\phi+H^2+2RH)^{1/2}-R\cos\phi$.

Here, when defined as $x(\phi)/H\equiv\beta(\phi)$, $\beta(\phi)=[(R/H)^2\cos^2\phi+1+2(R/H)]^{1/2}-(R/H)\cos\phi$. When an incident angle of the sunlight forms the angle $\phi$ with respect to the perpendicular, a length of the path of the sunlight in the air is $x(\phi)$, and $\beta(\phi)$ is a ratio of the length $x(\phi)$ of the path of the sunlight in the air to the thickness H of the air.

Assuming that R=6,400 Km and H=100 Km, $$\beta(\phi)=[64^2\cos^2\phi+129]^{1/2}-64\cos\phi.$$

In fact, the earth is an ellipsoid having an equatorial radius of 6,378 Km and a polar radius of 6,357 Km, but it may be assumed to be a sphere.

The thickness H of the air is not a numerical value that may be definitely determined in practice. Since the air has an atmospheric pressure of about 1/100 at an altitude of 30 km and about 1/1,000,000 at an altitude of 100 km, there is no big error even though the thickness H of the air is assumed to be 100 km. Especially, no matter how the thickness H of the air is set, $\beta(\phi)$ has a similar form. However, if H is greatly set, a value of $\beta(\phi)$ according to $\phi$ is reduced. Assuming that H=32 Km, $\beta(\phi=90°)=20.02$. Assuming that H=100 Km, $\beta(\phi=90°)=11.36$. Assuming that H=320 Km, $\beta(\phi=90°)=6.403$.

Next, let's predict how the sunlight is attenuated when passing through the air by setting up a simple model and combining the model with an actually measured value. It may be assumed that, when the sunlight travels along a path dx in the air, a variation di of the intensity is as follows: $di/dx=-\gamma(p,\lambda)i$.

The above formula is one of the differential equations that are most frequently and availably applied to analyze phenomena in the natural world.

The physical assumption that an attenuation coefficient $\gamma(p,\lambda)$ is a variable depending on a wavelength $\lambda$ of light and on a pressure p is easily acceptable, because the pressure p is directly associated with an altitude h from the earth's surface and it is directly associated with the density air molecules if a change in temperature can be ignored.

The above formula is arranged as $di/i=-\gamma(p,\lambda)dx$, and a solution thereof through integration, $i=I_0\exp[-\int\int(p,\lambda)dx]$ is obtained. Here, $I_0$ is the intensity of the sunlight immediately before the sunlight enters the atmosphere, and an integral of the formula is calculated along the path of the sunlight in the air.)

A more general solution is given as follows.

$i=\Sigma i\{I_0^i\exp[-\int\gamma_i(p)dx]\}$ Here, $I_0^i$ is the intensity of a light component having a wavelength $\lambda_i$ among light components of the sunlight immediately before the sunlight enters the atmosphere, and $\gamma_i(p)$ is an attenuation coefficient of the light component having the wavelength $\lambda_i$ in an environment in which the atmospheric pressure in the air is p. When measurement is made according to each wavelength band $\lambda_j$, a model of the intensity of the actual sunlight according to a change in altitude of the sun may be accurately set up. However, since it is sufficient only when a rough aspect is grasped, let's further simplify the assumption to infer a change in the intensity of the sunlight according to the change in altitude of the sun.

The assumption is as follows. It is assumed that the sunlight consists of two light components, one of which has a wavelength $\lambda_A$ capable of reaching the Earth's surface and the other of which has a wavelength $\lambda_B$ completely attenuated prior to reaching the Earth's surface. Short-wavelength light such as ultraviolet hardly reaches the Earth's surface due to absorption of ozone in the upper layer of the air.

In this case, $i=I_0^A \exp[-\int \gamma_A(p)dx] + I_0^B \exp[-\int \gamma_B(p)dx]$.

That is, since $\gamma_B(p) \gg \gamma_A(p)$ at least in a partial atmospheric pressure section, $I_0^A$ (intensity of the light having the wavelength $\lambda_A$ outside the atmosphere) is attenuated in the air, and only the remaining value thereof reaches the Earth's surface.

Let's substitute the model for the actually measured value to obtain values of $I_0^A$, $I_0^B$, and $\int \gamma_A(p)dx$.

AM0=1353 W/m²: solar constant outside the atmosphere
AM1=925 W/m²: intensity of the sunlight when $\phi=0°$
AM1.5=832 W/m²: intensity of the sunlight when $\phi 45°$
AM2=691 W/m²: intensity of the sunlight when $\phi=60°$ In FIG. 10a, AM0 is the intensity of the sunlight which is measured at Q or $Q_0$ that is the outermost shell of the atmosphere, AM1 is the intensity of the sunlight which is obtained by measuring the sunlight passing through a path $Q_0-P_0$ at $P_0$ on the Earth's surface, and AM1.5 and AM2 are the intensities of the sunlight which are obtained by measuring the sunlight passing through a path Q–P at P on the Earth's surface ($\phi=45°$ and $\phi=60°$ respectively).

Before substitution of the actually measured value, let's examine how integral values $\int \gamma_A(p)dx$ are mutually related when passing through the path $Q_0-P_0$ (hereinafter referred to as "0 path") and the path Q–P (hereinafter referred to as "$\phi$path"). Assuming that, when the sunlight passes through the 0 path (path $Q_0-P_0$), the integral value $T \equiv \int_{0\,path} \gamma_A(p)dx$, consequently a relationship in which, when the sunlight passes through the $\phi$path (path Q–P), the integral value $\int_{\phi\,path} \gamma_A(p)dx = T \times \beta(\phi)$ is formed.

The reason is as follows. As illustrated in FIG. 10b, when passing through atmospheric layers A1, A2, and A3 having different atmospheric pressures, sunlight AM1 cast in the vertical direction and sunlight AM($\phi$) obliquely cast at an angle $\phi$ with respect to the vertical direction are attenuated with the same attenuation coefficient $\gamma_A(p)$, and a ratio between the paths in each atmospheric layer is equally 1:$\beta(\phi)$. Therefore, a ratio between the integrals, $\int_{0\,path}(p)dx$ and $\int_{\phi\,path}(p)dx$, calculated according to the different paths is also 1:$\beta(\phi)$. That is, a ratio between integral values according to the two paths is identical to a ratio between lengths of the two paths.

Thus, applying T defined above and the examined result, the following formula is formed.

$$AM0 = 1353 = I_0^A + I_0^B \quad \text{(Formula 10a)}$$

$$AM1 = 925 = I_0^A \exp[-\int_{0\,path}\gamma_A(p)dx] = I_0^A \exp[-T] \quad \text{(Formula 10b)}$$

$$AM1.5 = 832 = I_0^A \exp[-\int_{\phi(=45°)path}\gamma_A(p)dx] = I_0^A \exp[-T \times \beta(\phi=45°)] \quad \text{(Formula 10c)}$$

$$AM2 = 691 = I_0^A \exp[-\int_{\phi(=60°)path}\gamma_A(p)dx] = I_0^A \exp[-T \times \beta(\phi=60°)] \quad \text{(Formula 10d)}$$

It has been previously described that, when the thickness of the atmosphere is assumed to be H=100 Km, the ratio $\beta(\phi)$ of the atmospheric layer passing length to H according to $\phi$ is given as $$x(\phi)/H = \beta(\phi) = [64^2 \cos^2\phi + 129]^{1/2} - 64 \cos\phi$$

A value of $\beta(\phi)$ required to calculate $I_0^A$, $I_0^B$, and T is as in Table 2 below.

TABLE 2

| $\phi$(degree) | $\beta(\phi)$ | | |
|---|---|---|---|
| 0 | 1 | $\beta(60°)-\beta(0°)$ | 0.955854 |
| 45 | 1.403499 | $\beta(45°)-\beta(0°)$ | 0.403499 |
| 60 | 1.955854 | $\beta(60°)-\beta(45°)$ | 0.552355 |

In the relationship among Formulas 10b, 10c and 10d, T is calculated as in Table 3 below.

TABLE 3

| Relationship | T |
|---|---|
| Between AM1-AM2 (10b/10d) | 0.30512 |
| Between AM1-AM1.5 (10b/10c) | 0.262606 |
| Between AM1.5-AM2 (10c/10d) | 0.336183 |
| Average | 0.3013 |

A value of $I_0^A$ calculated by applying the four values for T to Formulas 10b, 10c and 10d is given as in Table 4 below.

TABLE 4

| | T = 0.3013 | T = 0.30512 | T = 0.262606 | T = 0.336183 |
|---|---|---|---|---|
| AM1 | 1250.249398 | 1255.033758 | 1202.791155 | 1294.626015 |
| AM1.5 | 1269.924859 | 1276.750635 | 1202.791155 | 1333.637398 |
| AM2 | 1245.693301 | 1255.033758 | 1154.888916 | 1333.637398 |
| Average | 1255.289186 | 1262.272717 | 1186.823742 | 1320.633604 |

Considering that an inference is drawn based on an extremely simplified assumption and the nearly qualitative examination, a variation value of T and a variation value of $I_0^A$ are not very great. The T value (0.3051) extracted from the relationship of AM1-AM2 and the $I_0^A$ value (1,255 W/m²) obtained by causing the T value to correspond to AM2 are taken to be closest to an average value, and an $I_0^B$ value (98 W/m²) obtained by substituting the $I_0^A$ value for AM0 (Formula 10a) is taken. Since the light component having the wavelength $\lambda_B$ is not transferred to the Earth's surface, it does not matter that $I_0^B$ has any value in the aspect of the photovoltaic power generation.

Consequently, the intensity of the sunlight obliquely cast at the angle $\phi$ with respect to the perpendicular may be modeled as $i(\phi)=1255 \times \exp[-03051 \times \beta(\phi)]$ on the earth's surface.

The attenuation coefficient $\gamma(p)$ that is a function of the pressure p is not directly used in the above inference.

The calculated results of the atmosphere path length ratio $\beta(\phi)$ and the sunlight intensity model $i(\phi)$ according to the incident angle $\phi$ are as in Table 5 below. In FIG. 10c, a graph for normalized $\beta(\phi)$ and $i(\phi)$ is illustrated.

In the graph of FIG. 10c, $i(\phi)$ is denoted by Intensity($\phi$).

TABLE 5

| $\phi$(degree) | $\phi$(radian) | cos$\phi$ | $\beta(\phi)$ | $i(\phi)$ |
|---|---|---|---|---|
| 0 | 0 | 1 | 1 | 924.9973305 |
| 5 | 0.0872665 | 0.9961947 | 1.0037607 | 923.9365954 |
| 10 | 0.1745329 | 0.9848078 | 1.0151839 | 920.722098 |

TABLE 5-continued

| φ(degree) | φ(radian) | cosφ | β(φ) | i(φ) |
|---|---|---|---|---|
| 15 | 0.2617994 | 0.9659258 | 1.034705 | 915.2546594 |
| 20 | 0.3490659 | 0.9396926 | 1.0630955 | 907.3610156 |
| 25 | 0.4363323 | 0.9063078 | 1.1015385 | 896.7807958 |
| 30 | 0.5235988 | 0.8660254 | 1.1517548 | 883.1459387 |
| 35 | 0.6108652 | 0.819152 | 1.2162048 | 865.9496635 |
| 40 | 0.6981317 | 0.7660444 | 1.2984124 | 844.5004157 |
| 45 | 0.7853982 | 0.7071068 | 1.4034986 | 817.8536681 |
| 50 | 0.8726646 | 0.6427876 | 1.5390874 | 784.7108281 |
| 55 | 0.9599311 | 0.5735764 | 1.7169164 | 743.270211 |
| 60 | 1.0471976 | 0.5 | 1.9558537 | 691.0138659 |
| 65 | 1.134464 | 0.4226183 | 2.2879213 | 624.4342683 |
| 70 | 1.2217305 | 0.3420201 | 2.7712254 | 538.8245312 |
| 75 | 1.3089969 | 0.258819 | 3.5199027 | 428.7905374 |
| 80 | 1.3962634 | 0.1736482 | 4.7770645 | 292.1912235 |
| 85 | 1.4835299 | 0.0871557 | 7.0756376 | 144.910141 |
| 90 | 1.5707963 | 0 | 11.357817 | 39.23703138 |

Although the above model depends on an extremely simplified assumption, the actually measured value is combined to determine the value of a constant, and thus it may be substantially regarded as an average intensity of the light components reaching the Earth's surface. It has already been mentioned that a more accurate model may be obtained by division and actual measurement according to the magnitude $\lambda_i$ of the wavelength. Particularly, it is favorable to more precisely analyze the wavelength band contributed to the photoelectric conversion.

It can be found in FIG. 10c that it is not until φ is between 70° and 75° that the intensity of the sunlight is reduced to half. This gives a hint that, however low the altitude of the sun is, the photovoltaic power generation is sufficiently possible through the uniform light condensing using the flat mirrors of the disclosed technology. Of course, if the altitude of the sun is low, a probability of the sun being lost in the clouds increases.

Thus, even in the regions where the intensity of the sunlight is so weak that the photovoltaic power generation has not been persuasive by the conventional method, the photovoltaic power generation may be tried by the disclosed technology.

Although exemplary embodiments of the disclosed technology have been described for illustrative purposes, those skilled in the art will appreciate that various modifications, additions and substitutions are possible, without departing from the scope and spirit of the invention as disclosed in the accompanying claims. The scope of the disclosed technology should be limited only by the accompanying claims.

What is claimed is:

1. A device for photovoltaic power generation, comprising:
a frame;
a photovoltaic panel disposed on the frame;
flat mirrors disposed on the frame;
a rotation mechanism configured to rotate the frame biaxially to track a sunlight; and
a supporting structure configured to support the frame and the rotation mechanism,
wherein the photovoltaic panel and the flat mirrors are disposed on the frame to meet a predetermined relationship, said predetermined relationship including conditions that, in an orthogonal coordinate system whose reference lines vary to allow a unit vector in a traveling direction of the sunlight to be (0, 0, 1) when the rotation mechanism normally tracks the sun, (i) a unit normal vector of the light receiving surface of the photovoltaic panel is (0, 0, 1), and (ii) a z-axial component of a normal vector of a reflective surface of each of the flat mirrors has a negative value to allow the sunlight reflected by each of the flat mirrors to be uniformly incident upon the light receiving surface of the photovoltaic panel,
wherein the photovoltaic panel and the flat mirrors are disposed symmetrically on the frame such that projected images of the flat mirrors and a projected image of the photovoltaic panel form a (2m+1)x(2n+1) matrix on an x-y plane of the orthogonal coordinate system, said 'm' and 'n' are natural numbers, wherein the projected image of the photovoltaic panel is located in the center of the (2m+1)x(2n+1) matrix, and the projected images of the flat mirrors are arranged around the projected image of the photovoltaic panel,
wherein an x-axial length ($M_x^{i,j}$) and a y-axial length ($M_x^{i,j}$) of a given one of the flat mirrors ($M^{i,j}$) are set to meet conditions: $M_x^{i,j} \geq p_x \times (\cos 2\theta_x^{i,j}/\cos\theta_x^{i,j}) + \delta_x^{i,j}$ and $M_y^{i,j} \geq p_y \times (\cos 2\theta_y^{i,j}/\cos\theta_y^{i,j}) + \delta_y^{i,j}$, where (i) $p_x$ and $p_y$ represent an x-axis length and a-y axis length of the photovoltaic panel, respectively, (ii) $\delta_x^{i,j}$ and $\delta_y^{i,j}$ represent a minimum x-axis marginal length and a minimum y-axis marginal length of one of the flat mirrors ($M^{i,j}$), respectively, which are required to offset arrangement errors of the photovoltaic panel and the flat mirror ($M^{i,j}$), an operational error of the rotation mechanism, and vibration to be caused by an external force including wind, and (iii) $\theta_x^{i,j}$ and $\theta_y^{i,j}$ are obtained from equations: $\tan 2\theta_x^{i,j} = d_x^{i,j}/l^{i,j}$ and $\tan 2\theta_y^{i,j} = d_y^{i,j}/l^{i,j}$ where a vector ($d_x^{i,j}$, $d_y^{i,j}$, $l^{i,j}$) is a displacement vector from a center of the light receiving surface of the photovoltaic panel to a center of a reflective surface of the flat mirror ($M^{i,j}$) in the orthogonal coordinate system,
wherein said device further includes a cooling system configured to cool the photovoltaic panel, said cooling system comprising:
a housing configured to accommodate the photovoltaic panel and a fluidic coolant,
a transparent window configured to transmit incident light to be incident upon the light receiving surface of the photovoltaic panel, and
a holder configured to fix the photovoltaic panel to be disposed within the housing at a predetermined distance from an internal surface of the transparent window,
wherein the fluidic coolant wraps and cools the photovoltaic panel in the housing,
wherein both of the transparent window and the photovoltaic panel are planar and parallel to each other, and
wherein the rotation mechanism is further configured to rotate the frame according to a change in position of the sun such that the predetermined relationship between the photovoltaic panel and the flat mirrors is maintained.

2. The device according to claim 1, wherein a plurality of valves or holes are provided on a portion of the housing of the cooling system to allow the fluidic coolant to flow into and out of the housing and to allow electric wires to pass through.

3. The device according to claim 1, further comprising a circulator configured to cause forcible convection of the fluidic coolant in the housing of the cooling system.

4. The device according to claim 1, wherein the transparent window and the photovoltaic panel are removably coupled to the housing and the holder of the cooling system, respectively.

5. The device according to claim 1, wherein an optical filter to selectively transmit light of a wavelength effective for photoelectric conversion by the photovoltaic panel is provided on the transparent window of the cooling system.

6. The device according to claim 1, wherein the fluidic coolant of the cooling system comprises an optical filtering material or dye to selectively transmit light of a wavelength effective for photoelectric conversion by the photovoltaic panel.

7. The device according to claim 1, wherein the fluidic coolant of the cooling system is water.

8. The device according to claim 1, wherein the fluidic coolant of the cooling system includes an anti-foaming agent to inhibit bubbles from being generated in the fluidic coolant.

9. The device according to claim 1, wherein the fluidic coolant further includes an anti-freezing solution to prevent the fluidic coolant from being frozen.

10. The device according to claim 1, wherein an optical filter to selectively transmit light of a wavelength effective for photoelectric conversion by the photovoltaic panel is mounted on at least one of the reflective surface of each of the flat mirrors or the light receiving surface of the photovoltaic panel.

11. The device according to claim 1, wherein the sun tracking system comprises a first rotating means configured to rotate the frame in a vertical direction and a second rotating means configured to rotate the frame in a horizontal direction.

12. The device according to claim 1, wherein the frame is configured not to block the sunlight on an optical path from the sun to the photovoltaic panel via the flat mirrors.

13. The device according to claim 1, wherein one or more of the flat mirrors mounted on the frame is exempted from condensing the sunlight for the purpose of reducing the total intensity of the condensed sunlight incident upon the photovoltaic panel.

14. The device according to claim 1, further comprising a supplementary photovoltaic panel which is located in a rear side of the photovoltaic panel, wherein the supplementary photovoltaic panel is disposed on the frame such that a unit normal vector of the light receiving surface of the supplementary photovoltaic panel is (0, 0, −1).

15. The device according to claim 1, wherein said predetermined distance between the photovoltaic panel and the internal surface of the transparent window is set such that a distance between front surface of the photovoltaic panel and internal surface of the transparent window is shorter than a distance between rear surface of the photovoltaic panel and rear internal surface of the housing of the cooling system.

* * * * *